US011257942B2

(12) United States Patent
Miyajima et al.

(10) Patent No.: US 11,257,942 B2
(45) Date of Patent: Feb. 22, 2022

(54) RESISTIVE ELEMENT AND POWER AMPLIFIER CIRCUIT

(71) Applicant: Nuvoton Technology Corporation Japan, Kyoto (JP)

(72) Inventors: Kenichi Miyajima, Toyama (JP); Yoshiaki Katou, Toyama (JP); Akihiko Nishio, Ishikawa (JP); Kaname Motoyoshi, Hyogo (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 17/266,086

(22) PCT Filed: Mar. 24, 2020

(86) PCT No.: PCT/JP2020/013165
§ 371 (c)(1),
(2) Date: Feb. 4, 2021

(87) PCT Pub. No.: WO2020/203505
PCT Pub. Date: Oct. 8, 2020

(65) Prior Publication Data
US 2021/0265494 A1 Aug. 26, 2021

Related U.S. Application Data

(60) Provisional application No. 62/827,657, filed on Apr. 1, 2019.

(51) Int. Cl.
*H01L 21/00* (2006.01)
*H01L 23/00* (2006.01)
(Continued)

(52) U.S. Cl.
CPC ...... *H01L 29/7786* (2013.01); *H01L 29/0619* (2013.01); *H01L 29/2003* (2013.01);
(Continued)

(58) Field of Classification Search
CPC ............. H01L 29/7786; H01L 29/0619; H01L 29/2003; H01L 29/205; H01L 29/402;
(Continued)

(56) References Cited

U.S. PATENT DOCUMENTS 8,258,544 B2 * 9/2012 Nagahisa ............ H01L 29/7787
257/192
9,018,634 B2 * 4/2015 Tanaka .............. H01L 29/41725
257/76
(Continued)

FOREIGN PATENT DOCUMENTS

GB    2564482 A    1/2019
JP    2002-9252 A  1/2002
(Continued)

OTHER PUBLICATIONS

International Search Report issued in corresponding in International Patent Application No. PCT/JP2020/013165, dated Jun. 23, 2020, with English translation.
(Continued)

*Primary Examiner* — Nikolay K Yushin
(74) *Attorney, Agent, or Firm* — McDermott Will & Emery LLP

(57) ABSTRACT

A resistive element that includes: a substrate; a first nitride semiconductor layer; a second nitride semiconductor layer; a two-dimensional electron gas layer on the first nitride semiconductor layer side at an interface between the first nitride semiconductor layer and the second nitride semiconductor layer; a first electrode ohmically connected to the two-dimensional electron gas layer; a second electrode ohmically connected to the two-dimensional electron gas layer; and an insulating layer between the first electrode and the second electrode in plan view. The two-dimensional electron gas layer functions as an electric resistance element. A conductive layer is not provided above the insulating layer
(Continued)

between the first electrode and the second electrode in the plan view. The resistive element has a resistance-value stabilization structure that functions to keep a resistance value of the electric resistance element constant.

18 Claims, 26 Drawing Sheets

(51) Int. Cl.
| | |
|---|---|
| *H01L 27/00* | (2006.01) |
| *H01L 29/778* | (2006.01) |
| *H01L 29/06* | (2006.01) |
| *H01L 29/20* | (2006.01) |
| *H01L 29/205* | (2006.01) |
| *H01L 29/40* | (2006.01) |
| *H01L 29/423* | (2006.01) |
| *H01L 29/47* | (2006.01) |
| *H01L 29/8605* | (2006.01) |

(52) U.S. Cl.
CPC .......... *H01L 29/205* (2013.01); *H01L 29/402* (2013.01); *H01L 29/423* (2013.01); *H01L 29/475* (2013.01); *H01L 29/8605* (2013.01)

(58) Field of Classification Search
CPC . H01L 29/423; H01L 29/475; H01L 29/8605; H01L 29/86; H01L 27/0629; H01L 27/0605; H01L 27/156; H01L 27/15; H01L 27/0676; H01L 27/085; H01L 27/088; H01L 28/24; H01L 28/60; H01L 28/75; H01L 23/3171; H01L 23/291; H01L 23/528; H01L 23/0454; H01L 23/10; H01L 21/8252; H01L 21/0254; H01L 21/0262; H01L 21/0242; H01L 21/28575

See application file for complete search history.

(56) References Cited

U.S. PATENT DOCUMENTS

| | | | | |
|---|---|---|---|---|
| 10,038,064 | B2* | 7/2018 | Tanaka | .............. H01L 29/66462 |
| 10,256,100 | B2* | 4/2019 | Hirai | ................. H01L 29/66462 |
| 2005/0194612 | A1 | 9/2005 | Beach | |
| 2010/0155779 | A1* | 6/2010 | Murase | .............. H01L 29/7787 |
| | | | | 257/192 |
| 2010/0308373 | A1* | 12/2010 | Nagahisa | ............ H01L 29/7787 |
| | | | | 257/192 |
| 2014/0015591 | A1 | 1/2014 | Chen et al. | |
| 2014/0138704 | A1* | 5/2014 | Tanaka | ................ H01L 29/7787 |
| | | | | 257/76 |
| 2015/0021671 | A1 | 1/2015 | Nagahisa et al. | |
| 2015/0287713 | A1 | 10/2015 | Morita | |
| 2016/0197174 | A1 | 7/2016 | Kanechika et al. | |
| 2016/0260615 | A1* | 9/2016 | Hirai | .................. H01L 29/4238 |
| 2016/0343702 | A1 | 11/2016 | Tomita et al. | |
| 2017/0047410 | A1* | 2/2017 | Tanaka | ................ H01L 29/1054 |
| 2019/0096877 | A1 | 3/2019 | Kudymov et al. | |

FOREIGN PATENT DOCUMENTS

| | | |
|---|---|---|
| JP | 2015-23098 A | 2/2015 |
| JP | 5707463 B2 | 4/2015 |
| JP | 2016-219632 A | 12/2016 |
| WO | 2017/176287 A1 | 10/2017 |

OTHER PUBLICATIONS

Written Opnion issued in corresponding in International Patent Application No. PCT/JP2020/013165, dated Jun. 23, 2020, with English translation.
Partial Supplementary European Search Report dated Aug. 18, 2021 for the corresponding Europearn Patent Application No. 20784536.3.
Yung C. Liang et al., "AlGaN/GaN Power HEMT Devices for Future Energy Conversion Applications," IEEE 2nd Intenrational Symposium on Next-Generation Electronic (ISNE), Kaohsiung, Taiwan, 2013, pp. 7-10.
Vice Sodan et al., "influence of Field-Plate Configuration on Power Dissipation and Temperature Profiles in AlGaN/GaN on Silicon HEMTs," IEEE Transactions on Electron Devices, vol. 62, No. 8, 2015, pp. 2416-2422.
Extended European Search Report dated Nov. 26, 2021 issued in corresponding European Patent Application No. 20784536.3.

* cited by examiner

RESISTIVE ELEMENT AND POWER AMPLIFIER CIRCUIT

CROSS-REFERENCE OF RELATED APPLICATIONS

This application is the U.S. National Phase under 35 U.S.C. § 371 of International Patent Application No. PCT/JP2020/013165, filed on Mar. 24, 2020, which in turn claims the benefit of U.S. Provisional Application No. 62/827,657, filed on Apr. 1, 2019, the entire disclosures of which Applications are incorporated by reference herein.

TECHNICAL FIELD

The present disclosure relates to a semiconductor device, and particularly relates to a resistive element including nitride semiconductors and also to a power amplifier circuit using the resistive element.

BACKGROUND ART

A group III nitride semiconductor, especially a GaN-based nitride semiconductor or an AlGaN-based nitride semiconductor, has a high dielectric breakdown voltage owing to its wide band gap and allows easy formation of a heterostructure of, for instance, AlGaN and GaN. In the heterostructure, it is possible to generate a high-mobility and high-density electronic channel (two-dimensional electron gas (2DEG)) on the GaN layer side of an AlGaN/GaN interface. The electronic channel is generated by a difference in band gap and fixed charges caused by spontaneous polarization due to a difference in ionic radius as well as by piezo polarization due to a difference in lattice constant between AlGaN and GaN. By controlling the two-dimensional electron gas channel, it is possible to form a high electron mobility transistor (HEMT). Owing to its high-voltage, high-speed, and high-current characteristics, the group III nitride semiconductor is applied to electronic devices such as power field effect transistors (FETs) and diodes.

In recent years, it has become a common practice to use not only discrete products using FETs or diodes independently, but also integrated circuits including resistive elements and capacitors. Resistive elements to be used for integrated circuits include, for example, a metal thin-film resistance, a p-type or n-type group III nitride semiconductor formed by epitaxial growth, and a resistive element that uses two-dimensional electron gas, as disclosed in Patent Literature (PTL) 1. Particularly, forming a resistive element that uses two-dimensional electron gas on the same chip as an HEMT will be formed enables simultaneous formations of the HEMT and the resistive element and thus provides advantages in terms of manufacturing cost.

CITATION LIST

Patent Literature

PTL 1: Japanese Patent No. 5707463

SUMMARY OF THE INVENTION

Technical Problems

However, in a resistive element that uses two-dimensional electron gas as a resistance element, since a carrier concentration of the two-dimensional electron gas changes due to various factors, a resistance value of the resistive element may fluctuate during the use of the resistive element. In a circuit including such a resistive element, for example, an interconnect layer (conductive layer) in the circuit particularly generates an electric field around the layer, thereby strongly affecting the resistance value of the resistive element. This causes troubles such as an increase in the power consumption of the circuit, a failure to obtain desired characteristics, and in the worst case, dysfunction in the operation of the circuit. Other conceivable factors causing the fluctuation of the resistance value are, for example, carrier depletion caused by an electronic trap to a semiconductor surface level and an expansion of carrier scattering due to heat. Moreover, the group III nitride semiconductor, especially a GaN-based nitride semiconductor or an AlGaN-based nitride semiconductor, generates, due to piezo-polarization, high-density two-dimensional electron gas at the hetero-interface between GaN and AlGaN, for instance. Therefore, even with a change in an external stress, the carrier concentration of the two-dimensional electron gas fluctuates, and this causes the fluctuation of the resistance value. In the case of isolation caused by ion implantation, ions implanted in an isolation region migrate due to self-heating during operation and carrier scattering occurs, and this causes the fluctuation of the resistance value.

In view of the above, the present disclosure provides a resistive element, etc. which exhibits a resistance value that is stable with less fluctuation.

Solutions to Problems

A resistive element according to an aspect of the present disclosure includes: a substrate; a first nitride semiconductor layer above the substrate; a second nitride semiconductor layer above the first nitride semiconductor layer, the second nitride semiconductor layer having a band gap larger than a band gap of the first nitride semiconductor layer; a two-dimensional electron gas layer on a first nitride semiconductor layer side at an interface between the first nitride semiconductor layer and the second nitride semiconductor layer; a first electrode disposed above the first nitride semiconductor layer and ohmically connected to the two-dimensional electron gas layer; a second electrode disposed above the first nitride semiconductor layer and apart from the first electrode in plan view, and ohmically connected to the two-dimensional electron gas layer; and an insulating layer between the first electrode and the second electrode in the plan view, the insulating layer being in contact with a top surface of the second nitride semiconductor layer. The two-dimensional electron gas layer between the first electrode and the second electrode in the plan view functions as an electric resistance element. A conductive layer is not provided above the insulating layer between the first electrode and the second electrode in the plan view. The resistive element has a resistance-value stabilization structure that functions to keep a resistance value of the electric resistance element constant.

A resistive element according to an aspect of the present disclosure includes: a resistive element portion; and a conduction control layer. The resistive element portion includes: a substrate; a first nitride semiconductor layer above the substrate; a second nitride semiconductor layer above the first nitride semiconductor layer, the second nitride semiconductor layer having a band gap larger than a band gap of the first nitride semiconductor layer; a two-dimensional electron gas layer on a first nitride semiconductor layer side at an interface between the first nitride semiconductor layer and the second nitride semiconductor layer; a first electrode disposed above the first nitride semiconductor layer and ohmically connected to the two-dimensional electron gas layer; a second electrode disposed above the first nitride semiconductor layer and apart from the first electrode in plan view, and ohmically connected to the two-dimensional electron gas layer; and an insulating layer between the first electrode and the second electrode in the plan view, the insulating layer being in contact with a top surface of the second nitride semiconductor layer. The two-dimensional electron gas layer between the first electrode and the second electrode in the plan view functions as an electric resistance element. The conduction control layer is disposed above the insulating layer between the first electrode and the second electrode in the plan view; has a length, in a direction in which the first electrode and the second electrode are aligned in the plan view, which is at least half a space between the first electrode and the second electrode; and supplies an electric field to the two-dimensional electron gas layer to control a resistance value of the electric resistance element, in accordance with a voltage supplied from a source outside of the resistive element portion. The resistive element has a resistance-value stabilization structure that functions to keep a resistance value of the electric resistance element constant.

A power amplifier circuit according to an aspect of the present disclosure includes: the aforementioned resistive element; a field effect transistor above the substrate; and a capacitor. The field effect transistor includes a source electrode, a drain electrode, and a gate electrode. One of the first electrode and the second electrode is electrically connected to the gate electrode, and the other of the first electrode and the second electrode is electrically connected to the drain electrode via the capacitor.

A power amplifier circuit according to an aspect of the present disclosure includes: a field effect transistor above the substrate; and a bias circuit that supplies a gate voltage to the field effect transistor to set a drain current of the field effect transistor. The bias circuit includes the aforementioned resistive element.

Advantageous Effect of Invention

The present disclosure can provide a resistive element, etc. which exhibits a resistance value that is stable with less fluctuation.

DESCRIPTION OF EXEMPLARY EMBODIMENTS

Figure 1:
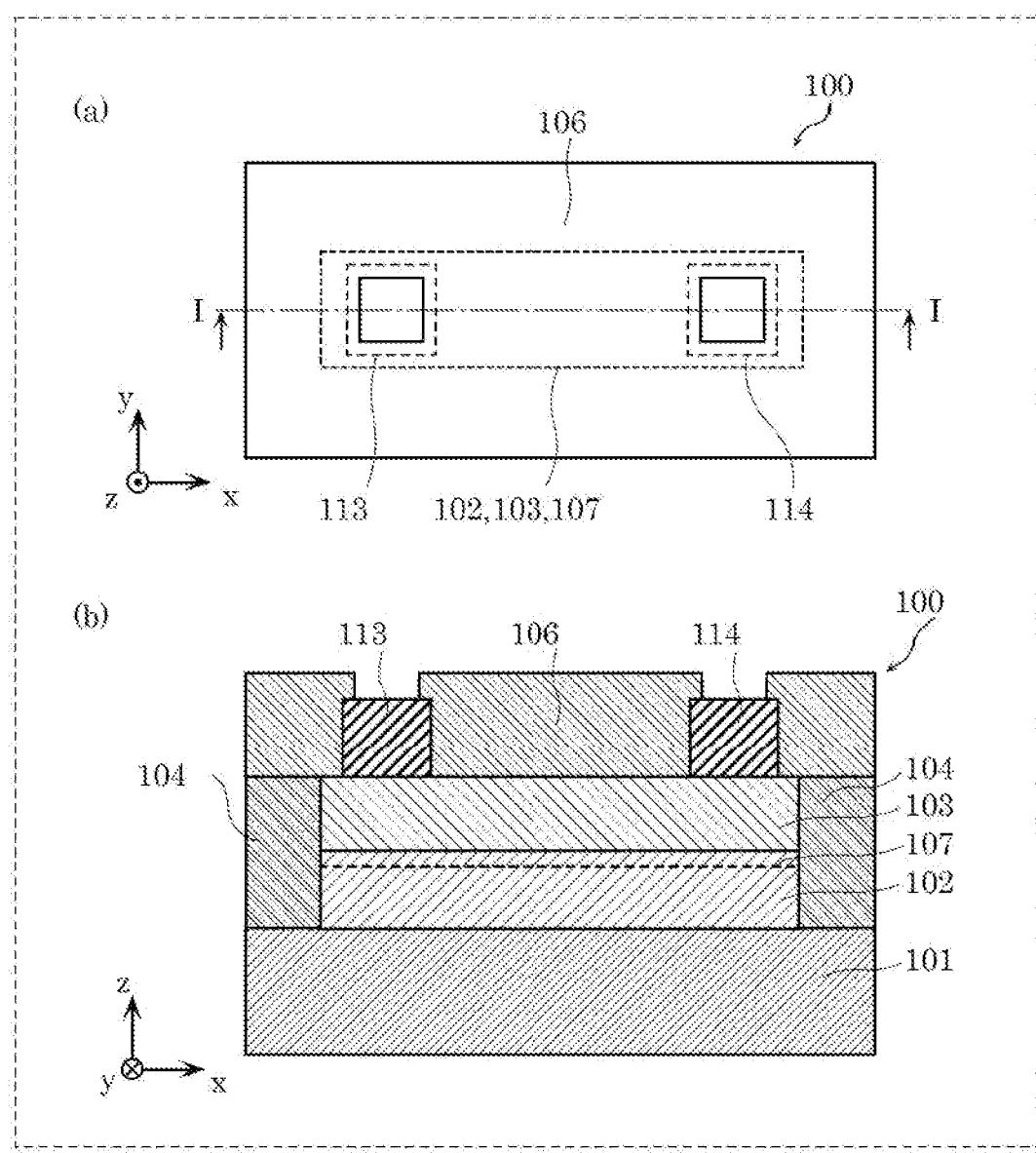
FIG. 1 illustrates a plan view and a cross-sectional view of a resistive element according to Embodiment 1.

Hereinafter, exemplary embodiments and variations thereof according to the present disclosure will be described in detail with reference to the drawings. It should be noted that each of the subsequently described exemplary embodiments and variations shows a generic or specific example. The numerical values, shapes, materials, structural elements, the arrangement and connection of the structural elements, etc. indicated in the following exemplary embodiments and variations are mere examples, and therefore are not intended to limit the present disclosure.

The terms "above" and "below" used in the subsequent description do not indicate an upward direction (vertically upward) and a downward direction (vertically downward), respectively, in an absolute spatial recognition. In addition, the terms "above" and "below" are applied not only to a case where two elements are disposed apart from each other and another element is interposed between the two elements, but also to a case where two elements are disposed in contact with each other.

In the subsequent description and the appended drawings, an x-axis, a y-axis, and a z-axis are three axes used in a three-dimensional orthogonal coordinate system. In each of the subsequent embodiments, a z-axis direction is defined as a vertical direction and a direction vertical to the z-axis (i.e., a direction parallel to an x-y plane) is defined as a horizontal direction. In each of the subsequent embodiments, a z-axis positive direction may be described as "above" while a z-axis negative direction may be described as "below", and a surface facing the z-axis positive direction may be described as "a top surface" whereas a surface facing the z-axis negative direction may be described as "a bottom surface".

In the subsequent description, the term "plan view" means a view of a substrate in a resistive element when a surface of the substrate is viewed from the z-axis positive direction, and this view is referred to as a plan view. A cross-sectional view is a view illustrating only a plane that appears at a cross section.

In the subsequent description, electrical connection is simply referred to as "connection".

In the subsequent description, Si denotes silicon, SiC denotes silicon carbide, AlN denotes nitride aluminum, GaN denotes nitride gallium, InN denotes nitride indium, InGaN denotes nitride indium gallium, AlGaN denotes nitride aluminum gallium, AlInGaN denotes nitride aluminum indium gallium, H denotes hydrogen, He denotes helium, B denotes boron, $BF_2$ denotes boron bifluoride, SiN denotes nitride silicon, $SiO_2$ denotes oxide silicon, SiON denotes oxynitride silicon, Ti denotes titan, Al denotes aluminum. Cr denotes chromium, Au denotes gold, TiN denotes nitride titanium, W denotes tungsten, Mo denotes molybdenum, Ta denotes tantalum, TaN denotes nitride tantalum, Pt denotes platinum, Pd denotes paradium, Ni denotes nickel, Fe denotes ferrum, Ag denotes silver, Cu denotes copper, and WSiN denotes tungsten silicide nitride.

Embodiment 1

First, a configuration of resistive element 100 according to Embodiment 1 will be described with reference to FIG. 1.

FIG. 1 illustrates a plan view and a cross-sectional view of resistive element 100 according to Embodiment 1. More specifically, (a) in FIG. 1 is the plan view of resistive element 100 and (b) in FIG. 1 is the cross-sectional view illustrating a cross section of resistive element 100 taken along the line I-I in (a) in FIG. 1.

Resistive element 100 includes substrate 101, first nitride semiconductor layer 102, second nitride semiconductor layer 103, two-dimensional electron gas layer 107, first electrode 113, second electrode 114, and an insulating layer (hereinafter referred to as insulating layer 106). Resistive element 100 has a resistance-value stabilization structure. Resistive element 100 may include isolation layer 104.

Substrate 101 is formed of Si substrate. Substrate 101 may be formed of, for example, a substrate made of sapphire, SiC, GaN, or AlN. Substrate 101 is a supporting member for stacking the following components.

First nitride semiconductor layer 102 is disposed above substrate 101. In this embodiment, first nitride semiconductor layer 102 is disposed in contact with the top surface of substrate 101. First nitride semiconductor layer 102 is made of GaN. First nitride semiconductor layer 102 may be made of, for example, a group III nitride semiconductor material such as InGaN, AlGaN, or AlInGaN.

Second nitride semiconductor layer 103 is disposed above first nitride semiconductor layer 102. In this embodiment, second nitride semiconductor layer 103 is disposed in contact with the top surface of first nitride semiconductor layer 102. Second nitride semiconductor layer 103 is made of AlGaN. Second nitride semiconductor layer 103 may be made of, for example, a group III nitride semiconductor material such as GaN, InGaN, AlGaN, or AlInGaN. Second nitride semiconductor layer 103 has a band gap larger than that of first nitride semiconductor layer 102.

As described above, second nitride semiconductor layer 103 may, but not limited to, be made of AlGaN. Second nitride semiconductor layer 103 may be a layered body including an AlGaN layer and another layer. Second nitride semiconductor layer 103 may include, as another layer, a cap layer made of GaN in a top layer (i.e., a layer on the upper side of second nitride semiconductor layer 103). Alternatively, second nitride semiconductor layer 103 may include a layer made of AlN in a layer contacting first nitride semiconductor layer 102 (i.e., at an interface between first nitride semiconductor layer 102 and second nitride semiconductor layer 103).

Two-dimensional electron gas layer 107 is disposed on the first nitride semiconductor layer 102 side at the interface between first nitride semiconductor layer 102 and second nitride semiconductor layer 103. As described above, in the case where second nitride semiconductor layer 103 is made of AlGaN and first nitride semiconductor layer 102 is made of GaN, two-dimensional electron gas layer 107 having high-density electrons on the GaN layer side in the vicinity of the AlGaN/GaN interface is generated due to a difference in band gap between AlGaN and GaN and piezo-polarized charges generated due to a difference in lattice constant between AlGaN and GaN. Two-dimensional electron gas layer 107 between first electrode 113 and second electrode 114 in plan view functions as an electric resistance element.

Isolation layer 104 is a layer for isolating resistive element 100 from elements other than resistive element 100. Isolation layer 104 can be formed by inactivating, through ion implantation, a portion of first nitride semiconductor layer 102 and a portion of second nitride semiconductor layer 103. H, He, B, or $BF_2$ is used as ions for the ion implantation.

Note that isolation layer 104 may be a layer insulated by heat oxidation.

Isolation layer 104 is disposed to surround first nitride semiconductor layer 102. In this embodiment, isolation layer 104 is disposed to surround first nitride semiconductor layer 102, second nitride semiconductor layer 103, and two-dimensional electron gas layer 107.

First electrode 113 is disposed above first nitride semiconductor layer 102 and is ohmically connected to two-dimensional electron gas layer 107. Second electrode 114 is disposed above first nitride semiconductor layer 102 and apart from first electrode 113 in the plan view, and is ohmically connected to two-dimensional electron gas layer 107. In this embodiment, first electrode 113 and second electrode 114 are disposed in contact with the top surface of second nitride semiconductor layer 103. Two-dimensional electron gas layer 107 between the two electrodes disposed apart from each other functions as an electric resistance element.

First electrode 113 and second electrode 114 each has a layered structure that includes at least one of Ti or Al. First electrode 113 and second electrode 114 may each have a layered structure that includes, for example, at least one of Cr or Au. First electrode 113 and second electrode 114 may each have a layered structure that includes, for example, at least two of Ti, Al, Cr, and Au. Note that the layered structure of first electrode 113 may be same as or different from that of second electrode 114.

First insulating layer 106 is disposed between first electrode 113 and second electrode 114 in the plan view and in contact with the top surface of second nitride semiconductor layer 103. Note that an area in which first insulating layer 106 is provided is not limited to a space between first electrode 113 and second electrode 114. As illustrated in (a) in FIG. 1, first insulating layer 106 may be disposed to surround first electrode 113 and second electrode 114 in the plan view. As illustrated in (b) in FIG. 1, first insulating layer 106 is provided neither above first electrode 113 nor above second electrode 114, and opening portions are provided. For this reason, the top surfaces of first electrode 113 and second electrode 114 are exposed.

First insulating layer 106 is made of SiN. First insulating layer 106 may be made of, for example, $SiO_2$, SiON, or AlN.

A conductive layer is not provided above first insulating layer 106 between first electrode 113 and second electrode 114 in the plan view. Furthermore, a conductive layer need not be provided in a region above second nitride semiconductor layer 103 and between first electrode 113 and second electrode 114 in the plan view.

The conductive layer is, for example, a conductive member such as a gate electrode in a field effect transistor or an interconnect layer for supplying power to first electrode 113 and second electrode 114. If such a conductive layer is provided above first insulating layer 106 between first electrode 113 and second electrode 114, an electric field is generated around the conductive layer. Therefore, the resistance value of two-dimensional electron gas layer 107 changes and is thus not stable. In this embodiment, such a conductive layer is not provided, and the resistance value of two-dimensional electron gas layer 107 is therefore less apt to change. Namely, it is possible to provide resistive element 100 which exhibits a resistance value that is stable with less fluctuation.

The resistance-value stabilization structure functions to keep the resistance value of the electric resistance element constant. With the provision of the resistance-value stabilization structure, the resistance value of two-dimensional electron gas layer 107 is much less apt to change.

The following describes in detail the resistance-value stabilization structure using each of variations of Embodiment 1.

Variation 1 of Embodiment 1

A resistance-value stabilization structure according to this variation is a structure in which first insulating layer 106 made of SiN has a composition ratio of Si/N that is at least 1.1 and at most 2.3. Note that in this variation, detailed description of structural elements that are commonly shared with Embodiment 1 will be omitted.

First, problems that could occur with resistive element 100 according to Embodiment 1 will be described with reference to FIG. 2A and FIG. 2B.

Figure 2A:
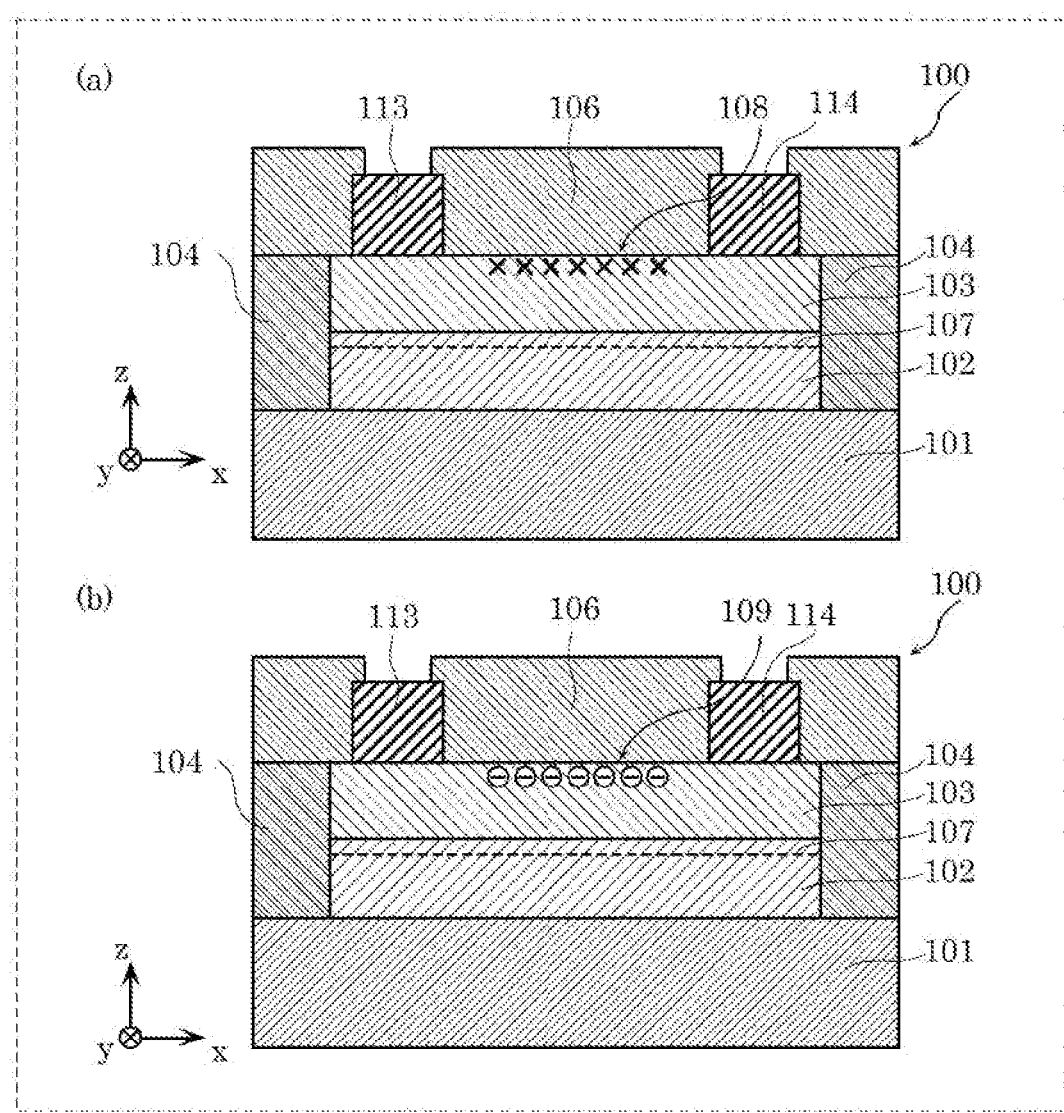
FIG. 2A illustrates cross-sectional views of the resistive element according to Embodiment 1 before and after voltage application.

FIG. 2A is cross-sectional views of resistive element 100 according to Embodiment 1 before and after voltage application. More specifically, (a) in FIG. 2A is a cross-sectional view of resistive element 100 before voltage application and (b) in FIG. 2A is a cross-sectional view of resistive element 100 after voltage application. As illustrated in (a) in FIG. 2A, surface level 108, which is a cause of an electronic trap such as an oxidized layer or a defect, is formed on the surface of second nitride semiconductor layer 103 (an interface between second nitride semiconductor layer 103 and first insulating layer 106, to be more specific). Upon the application of a constant voltage between first electrode 113 and second electrode 114, electrons flow through two-dimensional electron gas layer 107 due to a potential difference between first electrode 113 and second electrode 114. The flow of the electrons in two-dimensional electron gas layer 107 is accelerated in an electric field generated by the application of the voltage and some of the electrons may be trapped at surface level 108 (see (b) in FIG. 2A). Trapped electrons 109 cause depletion in the lower portion of two-dimensional electron gas layer 107 and the carrier concentration of two-dimensional electron gas layer 107 decreases.

Figure 2B:
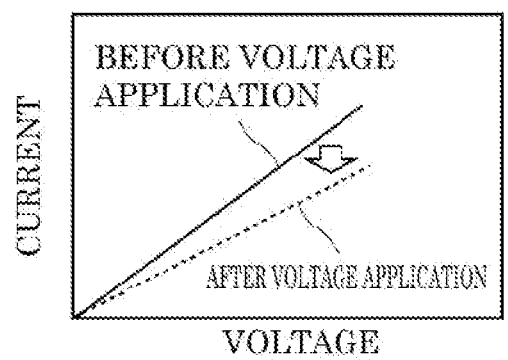
FIG. 2B is a conceptual diagram illustrating current-voltage characteristics of the resistive element according to Embodiment 1 before and after voltage application.

FIG. 2B is a conceptual diagram illustrating current-voltage characteristics of resistive element 100 according to Embodiment 1 before and after voltage application. As described above, with the application of the voltage, the carrier concentration of two-dimensional electron gas layer 107 decreases, and this may increase the resistance value of resistive element 100.

In view of the above, the resistance-value stabilization structure according to this variation is a structure related to an insulating layer.

Figure 3:
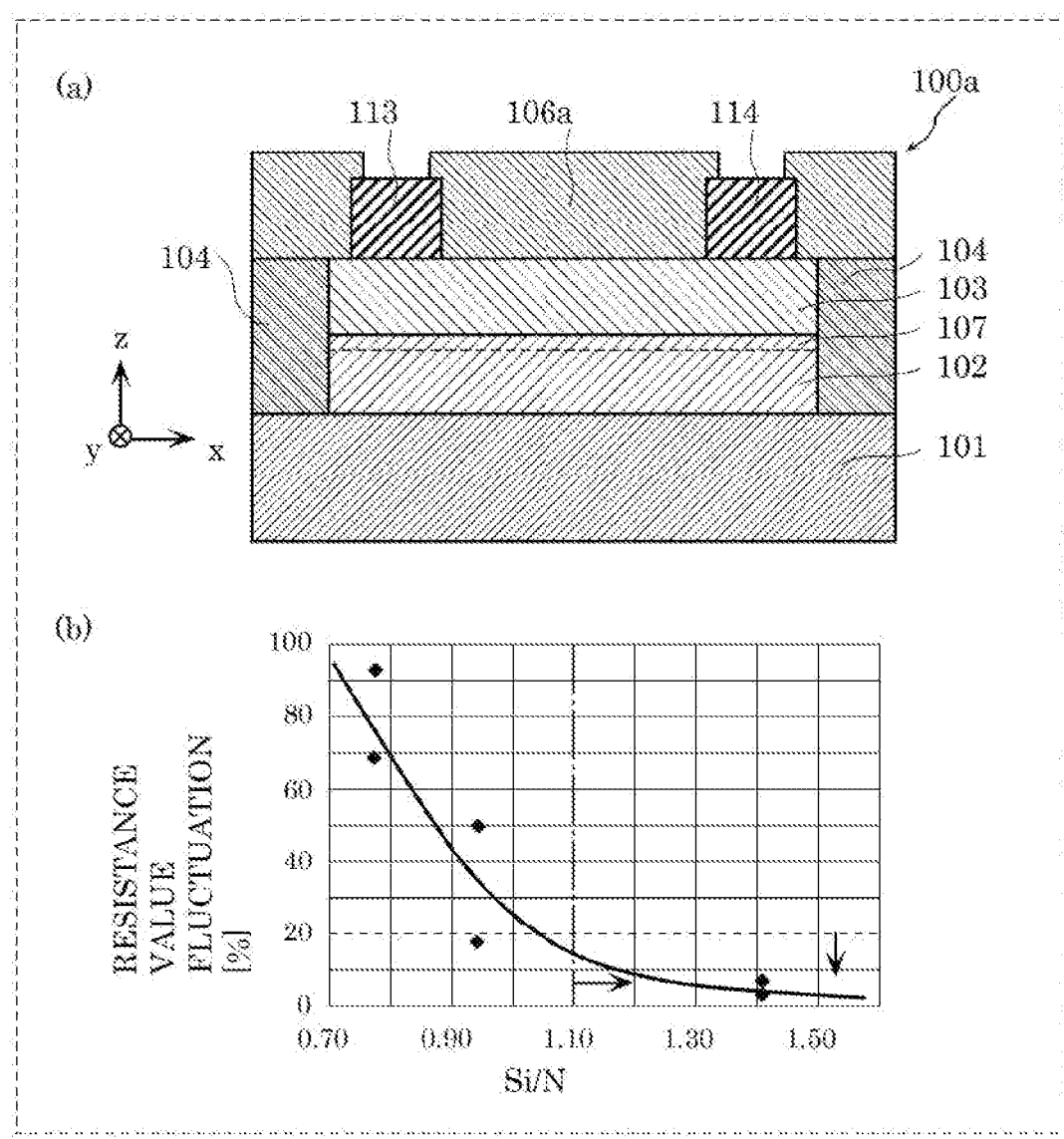
FIG. 3 is a diagram illustrating a cross-sectional view and a resistance fluctuation rate of a resistive element according to Variation 1 of Embodiment 1.

FIG. 3 is a diagram illustrating a cross-sectional view and a resistance fluctuation rate of resistive element 100a according to Variation 1 of Embodiment 1. More specifically, (a) in FIG. 3 is the cross-sectional view of resistive element 100a and corresponds to the cross-sectional view in (b) in FIG. 1. (b) in FIG. 3 is a diagram illustrating a relation between a resistance fluctuation rate and a composition ratio of Si/N of first insulating layer 106a when the voltage of 50 V is applied to resistive element 100a.

Resistive element 100a according to Variation 1 includes substrate 101, first nitride semiconductor layer 102, second nitride semiconductor layer 103, isolation layer 104, first insulating layer 106a, two-dimensional electron gas layer 107, first electrode 113, and second electrode 114. Resistive element 100a has a resistance-value stabilization structure. In resistive element 100a, a conductive layer is not provided above first insulating layer 106a between first electrode 113 and second electrode 114 in plan view.

First insulating layer 106a according to this variation is made of silicon nitride (SiN). The composition ratio of Si/N of first insulating layer 106a at an interface between first insulating layer 106a and second nitride semiconductor layer 103 is at least 1.1 and at most 2.3. The composition ratio of Si/N of first insulating layer 106a, for example, in a region within 10 nm from the interface is at least 1.1 and at most 2.3. The resistance-value stabilization structure according to this variation is a structure in which first insulating layer 106a has the above-described configuration.

A resistance fluctuation rate is a value indicating a rate of change in resistance values before and after voltage application. As illustrated in (b) in FIG. 3, when the composition ratio of Si/N increases, the resistance fluctuation rate is suppressed. This will be explained as follows. With a surplus amount of Si in SiN, Si dangling-bonds are present in a large number and perform oxygen-gettering in a surface oxidized layer that is one of the causes of surface level 108, and this cancels surface level 108. Since surface level 108 is thus canceled, the generation of trapped electrons 109 as illustrated in FIG. 2A is inhibited and the resistance fluctuation rate is suppressed.

Moreover, setting the composition ratio of Si/N to at least 1.1 enables the resistance fluctuation rate indicating a value that is sufficiently below 20%. The resistance fluctuation rate below 20% can fully meet a required specification of a product. Setting the composition ratio of Si/N to at least 1.2 enables the resistance fluctuation rate to be at most 10% and setting the composition ratio of Si/N to at least 1.5 enables the resistance fluctuation rate to be at most 5%. Accordingly, it is possible to fully meet a required specification of a highly-challenging product.

Figure 4A:
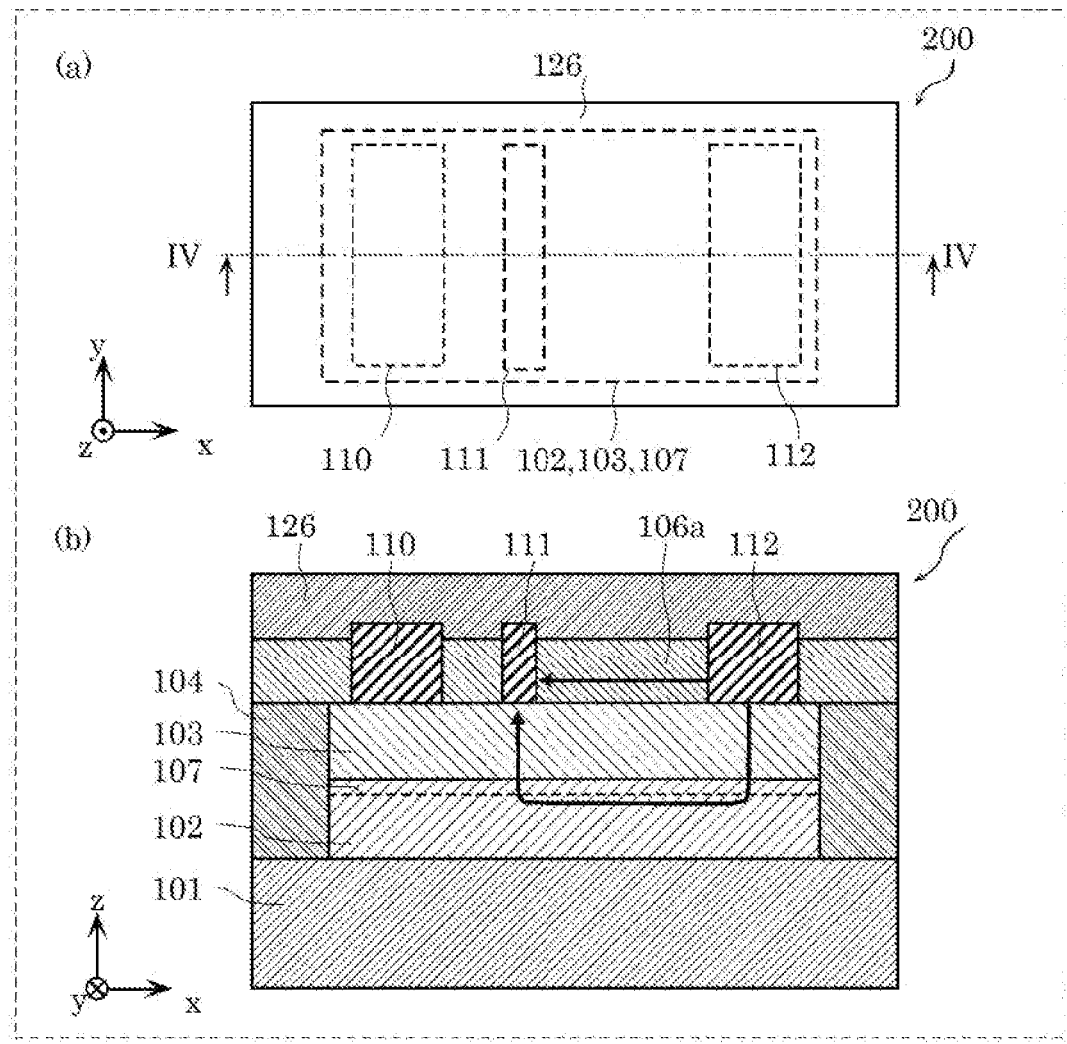
FIG. 4A illustrates a plan view and a cross-sectional view of a field effect transistor formed on the same substrate that the resistive element according to Variation 1 of Embodiment 1 includes.

The following describes field effect transistor 200, which is formed on the same substrate (substrate 101) that resistive element 100a according to this variation includes. As described in the "BACKGROUND ART" above, integrated circuits including FETs and resistive elements are known. FIG. 4A illustrates a plan view and a cross-sectional view of field effect transistor 200 formed on the same substrate (substrate 101) that resistive element 100a according to Variation 1 includes. More specifically, (a) in FIG. 4A is the plan view of field effect transistor 200 and (b) in FIG. 4A is the cross-sectional view illustrating a cross section of field effect transistor 200 taken along the line IV-IV in (a) in FIG. 4A.

Field effect transistor 200 includes substrate 101, first nitride semiconductor layer 102, second nitride semiconductor layer 103, two-dimensional electron gas layer 107, source electrode 110, gate electrode 111, drain electrode 112, first insulating layer 106a, second insulating layer 126, and isolation layer 104.

For example, structural elements that are commonly provided for resistive element 100a and field effect transistor 200 and are assigned with like reference signs may be formed at the same time.

In field effect transistor 200, first insulating layer 106a is disposed in contact with the top surface of second nitride semiconductor layer 103. Source electrode 110 and drain electrode 112 are disposed in the opening portions of first insulating layer 106a and are ohmically connected to two-dimensional electron gas layer 107. Gate electrode 111 that is Schottky-contacted to second nitride semiconductor layer 103 is disposed between source electrode 110 and drain electrode 112. Note that gate electrode 111 may contact second nitride semiconductor layer 103 via a p-n junction. Alternatively, a gate insulating layer may be provided. The gate insulating layer may be inserted between gate electrode 111 and second nitride semiconductor layer 103 to form a metal-insulator-semiconductor (MIS) structure.

Furthermore, second insulating layer 126 is disposed above first insulating layer 106a, source electrode 110, gate electrode 111, and drain electrode 112. Second insulating layer 126 is made of SiN. Second insulating layer 126 may be made of, for example, $SiO_2$, SiON, or AlN. Second insulating layer 126 and first insulating layer 106a may, but not limited to, have the same materials and compositions.

(b) in FIG. 4A shows a leak current path between the gate and the drain of field effect transistor 200. The leak current path from drain electrode 112 to gate electrode 111 includes two paths, one passing through two-dimensional electron gas layer 107 and the other passing through first insulating layer 106a.

Figure 4B:
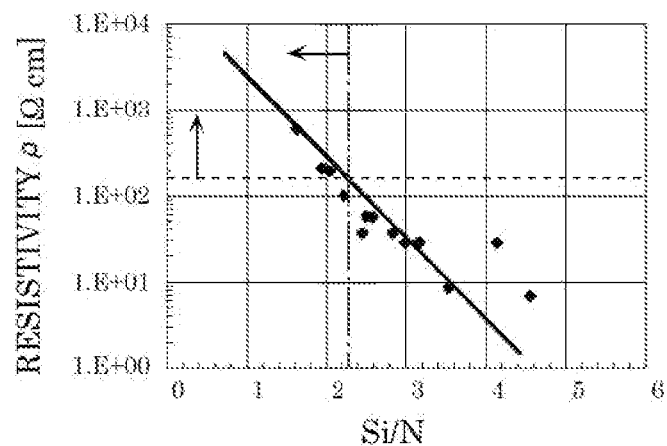
FIG. 4B is a diagram illustrating a relation between resistivity and a composition ratio of Si/N of the first insulating layer according to Variation 1 of Embodiment 1.

FIG. 4B is a diagram illustrating a relation between resistivity and a composition ratio of Si/N of first insulating layer 106a according to Variation 1 of Embodiment 1. The resistivity decreases with an increase in the composition ratio of Si/N. Therefore, if the composition ratio of Si/N increases too much, the amount of a leak current passing through first insulating layer 106a increases and the amount of a leak current flowing in a reverse direction between the gate and the drain increases. Setting the composition ratio of Si/N to be at most 2.3 achieves the resistivity of at least $1.7 \times 10^2$ Ωcm. Accordingly, the amount of the leak current passing through first insulating layer 106a in the reverse direction between the gate and the drain can be reduced to at most 10% of the total amount of the leak currents (i.e., a sum of the leak current passing through two-dimensional electron gas layer 107 and the leak current passing through first insulating layer 106a). In other words, it is possible to fully meet a required specification of a product. The composition ratio of Si/N of at most 2.0 achieves the resistivity of at least $3.0 \times 10^2$ Ωcm, and what is more, the composition ratio of Si/N of at most 1.8 achieves the resistivity of at least $4.0 \times 10^2$ Ωcm. Accordingly, it is possible to fully meet a required specification of a highly-challenging product.

With the above-described configuration, the surface level is canceled by Si dangling-bonds, and therefore, the resistance value of two-dimensional electron gas layer 107 is less apt to change. Namely, it is possible to provide resistive element 100a which exhibits a resistance value that is stable with less fluctuation.

Moreover, by setting the composition ratio of Si/N to the aforementioned ratio, it is possible to fully meet a required specification of a highly-challenging product.

Variation 2 and Variation 3 of Embodiment 1

The resistance-value stabilization structure according to Variation 1 of Embodiment 1 is a structure in which the composition ratio of Si/N of the insulating layer made of SiN is at least 1.1 and at most 2.3, but a resistance-value stabilization structure according to the present disclosure is not limited to such a structure.

A resistance-value stabilization structure according to Variation 2 has a first hole injection electrode. A resistance-value stabilization structure according to Variation 3 has a first hole injection electrode and a second hole injection electrode. It should be noted that in this embodiment, detailed description of structural elements commonly shared with Embodiment 1 and Variation 1 thereof will be omitted.

Figure 5:
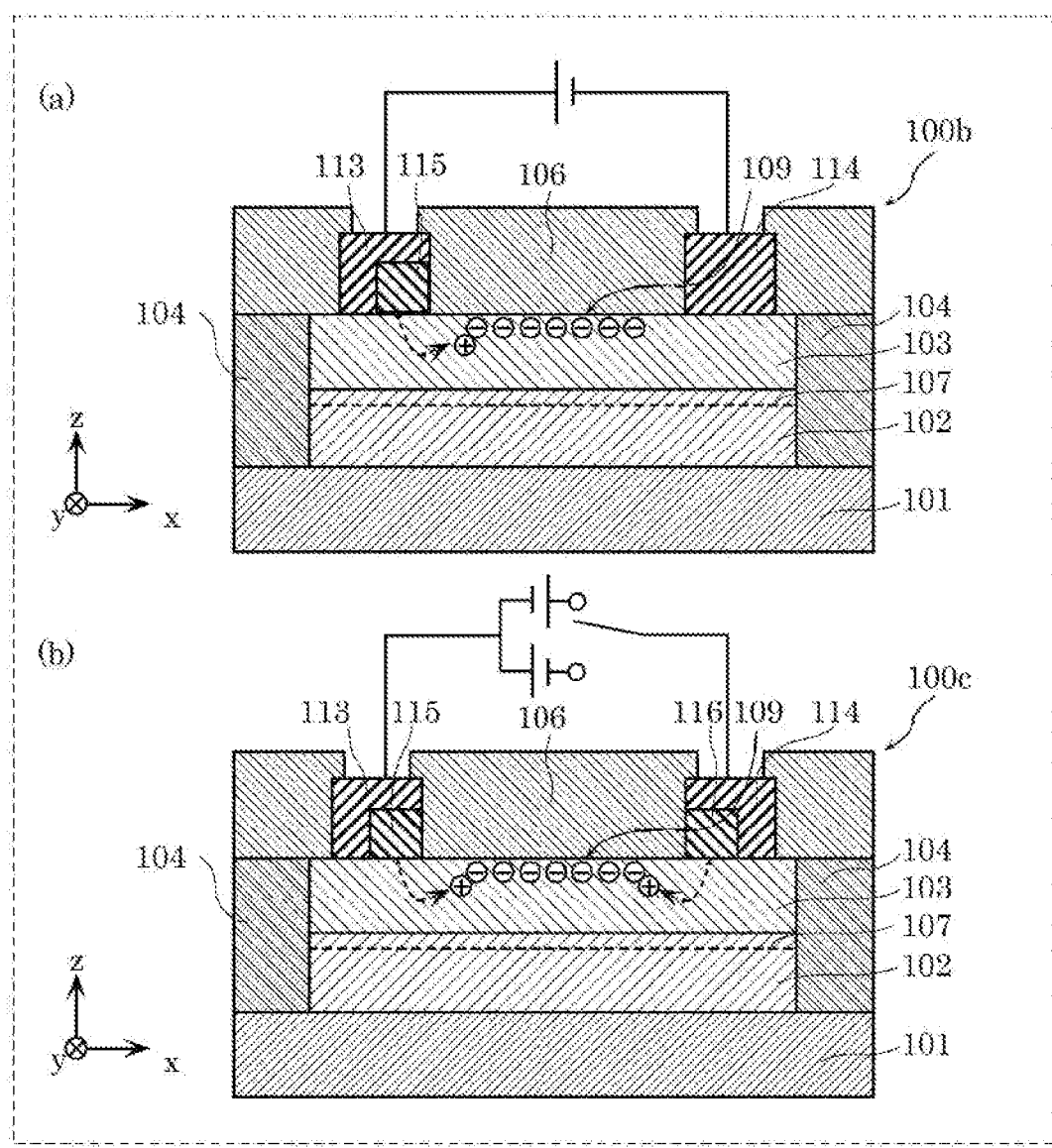
FIG. 5 illustrates cross-sectional views of a resistive element according to Variation 2 of Embodiment 1 and a resistive element according to Variation 3 of Embodiment 1.

FIG. 5 illustrates cross-sectional views of resistive element 100b according to Variation 2 of Embodiment 1 and resistive element 100c according to Variation 3 of Embodiment 1. More specifically, (a) in FIG. 5 is a cross-sectional view of resistive element 100b according to Variation 2 of Embodiment 1. (b) in FIG. 5 is a cross-sectional view of resistive element 100c according to Variation 3 of Embodiment 1.

First, resistive element 100b according to Variation 2 will be described with reference to (a) in FIG. 5.

Resistive element 100b according to Variation 2 includes the structural elements included in resistive element 100 according to Embodiment 1 and first hole injection electrode 115. In resistive element 100b according to Variation 2, a conductive layer is not provided above first insulating layer 106 between first electrode 113 and second electrode 114 in plan view.

First hole injection electrode 115 is disposed in contact with the top surface of second nitride semiconductor layer 103 on the first electrode 113 side between first electrode 113 and second electrode 114. In this variation, first hole injection electrode 115 is inserted between second nitride semiconductor layer 103 and a portion of first electrode 113, as illustrated in (a) in FIG. 5. First hole injection electrode 115 is electrically connected to first electrode 113.

First hole injection electrode 115 is made of p-type GaN. First hole injection electrode 115 may be made of, for example, InGaN, AlGaN or AlInGaN that is a p-type group 11 nitride semiconductor. The resistance-value stabilization structure according to this variation is a structure in which first hole injection electrode 115 has the above-described configuration.

First hole injection electrode 115 injects a hole in second nitride semiconductor layer 103 when the potential of first electrode 113 is higher than that of second electrode 114.

The details are as follows. With the potential of first electrode 113 being higher than that of second electrode 114, a current flows from first electrode 113 to second electrode 114. Then, a hole is injected from first hole injection electrode 115 and the hole is capable of cancelling trapped electrons 109 trapped to the surface level of second nitride semiconductor layer 103.

As described above, trapped electrons 109 could cause an increase in the resistance value of two-dimensional electron gas layer 107.

Since the above-described configuration allows the cancelling of trapped electrons 109, the resistance value of two-dimensional gas layer 107 is less apt to change. Namely, it is possible to provide resistive element 100b which exhibits a resistance value that is stable with less fluctuation.

Note that in this variation, it is recommended to use resistive element 100b so that a potential higher than that of second electrode 114 is supplied to first electrode 113. Accordingly, a hole is injected from first hole injection electrode 115 and it is possible to cancel trapped electrons 109 trapped to the surface level of second nitride semiconductor layer 103 and thus achieve resistive element 100b which exhibits a resistance value that is stable with less fluctuation.

Subsequently, resistive element 100c according to Variation 3 will be described with reference to (b) in FIG. 5.

Resistive element 100c according to Variation 3 includes the structural elements included in resistive element 100 according to Embodiment 1, first hole injection electrode 115, and second hole injection electrode 116. In resistive element 100c according to Variation 3, a conductive layer is not provided above first insulating layer 106 between first electrode 113 and second electrode 114 in plan view.

First hole injection electrode 115 according to Variation 3 has the same configuration as that of first hole injection electrode 115 according to Variation 2.

Second hole injection electrode 116 is disposed in contact with the top surface of second nitride semiconductor layer 103 on the second electrode 114 side between first electrode 113 and second electrode 114. In this variation, second hole injection electrode 116 is inserted between second nitride semiconductor layer 103 and a portion of second electrode 114, as illustrated in (b) in FIG. 5. Second hole injection electrode 116 is electrically connected to second electrode 114.

Second hole injection electrode 116 is made of p-type GaN. Second hole injection electrode 116 may be made of, for example, InGaN, AlGaN, or AlInGaN that is a p-type group III nitride semiconductor. A resistance-value stabilization structure according to this variation is a structure in which first hole injection electrode 115 and second hole injection electrode 116 each have the above-described configuration.

Second hole injection electrode 116 injects a hole in second nitride semiconductor layer 103 when the potential of second electrode 114 is higher than that of first electrode 113.

In this variation, with the potential of first electrode 113 being higher than that of second electrode 114, a hole is injected from first hole injection electrode 115, and with the potential of second electrode 114 being higher than that of first electrode 113, a hole is injected from second hole injection electrode 116. In either case, the injected hole is capable of cancelling trapped electrons 109 trapped to the surface level of second nitride semiconductor layer 103. In other words, a hole is injected from either of the two electrodes (first electrode 113 and second electrode 114).

Since the above-described configuration allows the cancelling of trapped electrons 109, the resistance value of two-dimensional gas layer 107 is less apt to change.

Namely, it is possible to provide resistive element 100c which exhibits a resistance value that is stable with less fluctuation.

Note that resistive element 100c according to this variation allows hole injection from either of the two electrodes and can be used as an element that allows a current to flow bidirectionally.

Variation 4 and Variation 5 of Embodiment 1

A resistance-value stabilization structure according to the present disclosure is not limited to the structure described in the aforementioned Embodiment 1 or any one of the variations thereof.

A resistance-value stabilization structure according to Variation 4 has a first electron extraction electrode. A resistance-value stabilization structure according to Variation 5 has a first electron extraction electrode and a second electron extraction electrode. Note that in these variations, detailed description of structural elements commonly shared with Embodiment 1 and the variations thereof will be omitted.

Figure 6:
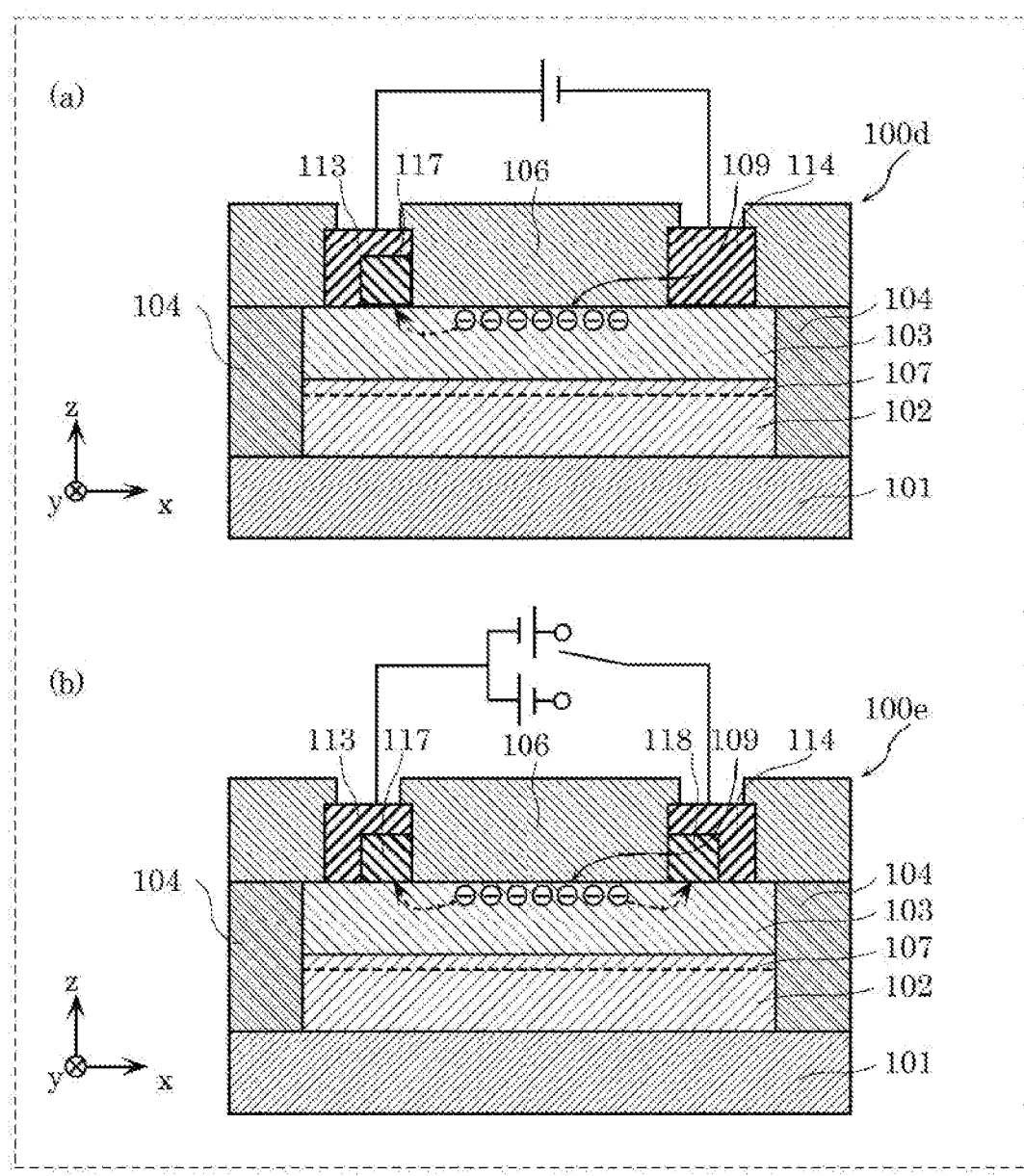
FIG. 6 illustrates cross-sectional views of a resistive element according to Variation 4 of Embodiment 1 and a resistive element according to Variation 5 of Embodiment 1.

FIG. 6 illustrates cross-sectional views of resistive element 100d according to Variation 4 of Embodiment 1 and resistive element 100e according to Variation 5 of Embodiment 1. More specifically, (a) in FIG. 6 is a cross-sectional view of resistive element 100d according to Variation 4. (b) in FIG. 6 is a cross-sectional view of resistive element 100e according to Variation 5 of Embodiment 1.

First, resistive element 100*d* according to Variation 4 will be described with reference to (a) in FIG. 6.

Resistive element 100*d* according to Variation 4 includes the structural elements included in resistive element 100 according to Embodiment 1 and first electron extraction electrode 117. In resistive element 100*d* according to Variation 4, a conductive layer is not provided above first insulating layer 106 between first electrode 113 and second electrode 114 in plan view.

First electron extraction electrode 117 is disposed in contact with the top surface of second nitride semiconductor layer 103 on the first electrode 113 side between first electrode 113 and second electrode 114. In this variation, first electron extraction electrode 117 is inserted between second nitride semiconductor layer 103 and a portion of first electrode 113. First electron extraction electrode 117 is electrically connected to first electrode 113.

First electron extraction electrode 117 is Schottky-contacted to second nitride semiconductor layer 103. First electron extraction electrode 117 has a layered structure including Ni. First electron extraction electrode 117 may have, for example, a layered structure including at least one of Ti, TiN, Hf, Pd, or Pt. The resistance-value stabilization structure according to this variation is a structure in which first electron extraction electrode 117 has the above-described configuration.

First electron extraction electrode 117 extracts electrons from second nitride semiconductor layer 103 when the potential of first electrode 113 is higher than that of second electrode 114.

The details are as follows. With the potential of first electrode 113 being higher than that of second electrode 114, a current flows from first electrode 113 to second electrode 114. This enables first electron extraction electrode 117, which is Schottky-contacted to second nitride semiconductor layer 103, to extract trapped electrons 109 trapped to the surface level.

As described above, trapped electrons 109 could cause an increase in the resistance value of two-dimensional electron gas layer 107.

Since the above-described configuration allows the extraction of trapped electrons 109, the resistance value of two-dimensional electron gas layer 107 is less apt to change. Namely, it is possible to provide resistive element 100*d* which exhibits a resistance value that is stable with less fluctuation.

Subsequently, resistive element 100*e* according to Variation 5 will be described with reference to (b) in FIG. 6.

Resistive element 100*e* according to Variation 5 includes the structural elements included in resistive element 100 according to Embodiment 1, first electron extraction electrode 117, and second electron extraction electrode 118. In resistive element 100*e* according to Variation 5, a conductive layer is not provided above first insulating layer 106 between first electrode 113 and second electrode 114 in plan view.

First electron extraction electrode 117 according to Variation 5 has the same configuration as that of first electron extraction electrode 117 according to Variation 4.

Second electron extraction electrode 118 is disposed in contact with the top surface of second nitride semiconductor layer 103 on the second electrode 114 side between first electrode 113 and second electrode 114. In this variation, second electron extraction electrode 118 is inserted between second nitride semiconductor layer 103 and a portion of second electrode 114, as illustrated in (b) in FIG. 6. Second electron extraction electrode 118 is electrically connected to second electrode 114.

Second electron extraction electrode 118 has a layered structure including Ni. Second electron extraction electrode 118 may have, for example, a layered structure including at least one of Ti, TiN, Hf, Pd, or Pt. The resistance-value stabilization structure according to this variation is a structure in which first electron extraction electrode 117 and second electron extraction electrode 118 each have the above-described configuration.

Second electron extraction electrode 118 extracts electrons from second nitride semiconductor layer 103 when the potential of second electrode 114 is higher than that of first electrode 113.

In this variation, with the potential of second electrode 114 being higher than that of first electrode 113, first electron extraction electrode 117 extracts electrons, and with the potential of first electrode 113 being higher than that of second electrode 114, second electron extraction electrode 118 extracts electrons.

Since the above-described configuration allows the extraction of trapped electrons 109, the resistance value of two-dimensional electron gas layer 107 is less apt to change.

Namely, it is possible to provide resistive element 100*e* which exhibits a resistance value that is stable with less fluctuation.

Variation 6 of Embodiment 1

A resistance-value stabilization structure according to the present disclosure is not limited to the structure described in the aforementioned Embodiment 1 or any one of the variations thereof.

A resistance-value stabilization structure according to Variation 6 has a stress buffer layer. Note that in this variation, detailed description of structural elements commonly shared with Embodiment 1 and the variations thereof will be omitted.

Figure 7A:
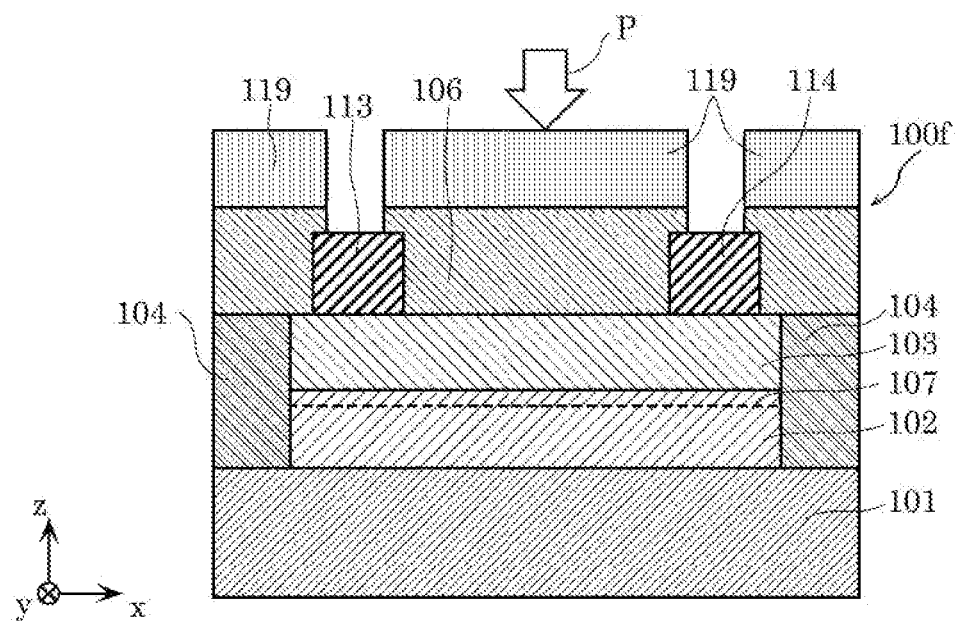
FIG. 7A is a cross-sectional view of a resistive element according to Variation 6 of Embodiment 1.

FIG. 7A is a cross-sectional view of resistive element 100*f* according to Variation 6 of Embodiment 1. Stress P that is externally applied to resistive element 100*f* is illustrated in FIG. 7A.

Resistive element 100*f* according to Variation 6 includes the structural elements included in resistive element 100 according to Embodiment 1 and stress buffer layer 119. In resistive element 100*f* according to Variation 6, a conductive layer is not provided above first insulating layer 106 between first electrode 113 and second electrode 114 in plan view.

Stress buffer layer 119 is disposed above first insulating layer 106. The plan-view shape of stress buffer layer 119 may match the plan-view shape of first insulating layer 106. Stress buffer layer 119 is a layer for buffering stress that is externally applied to resistive element 100*f*. The resistance-value stabilization structure according to this variation is a structure in which stress buffer layer 119 has the above-described configuration.

The following describes stress externally applied to resistive element 100*f*. In the process of manufacturing resistive element 100*f*, stress is externally applied to resistive element 100*f*, for example, when a sealing material to be used for a semiconductor chip assembly is formed. The following describes, with reference to FIG. 7B, how the stress affects the current-voltage characteristics of resistive element 100*f*.

Figure 7B:
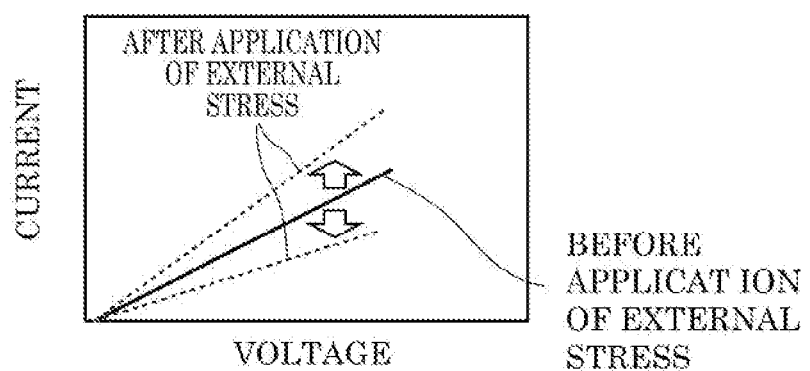
FIG. 7B is a conceptual diagram illustrating current-voltage characteristics of the resistive element according to Variation 6 of Embodiment 1 before and after stress is externally applied.

FIG. 7B is a conceptual diagram illustrating current-voltage characteristics of resistive element 100*f* according to Variation 6 of Embodiment 1 before and after stress is externally applied. In this variation, two-dimensional electron gas layer 107 generated on the GaN layer (first nitride semiconductor layer 102) side at an interface between AlGaN (second nitride semiconductor layer 103) and GaN (first nitride semiconductor layer 102) is caused by piezo-polarized charges. Therefore, when stress is applied to resistive element 100f, the carrier concentration of two-dimensional electron gas layer 107 changes and the resistance value of two-dimensional electron gas layer 107 fluctuates.

Stress buffer layer 119 is made of polyimide. Stress buffer layer 119 may be made of, for example, a fluorine resin or a benzocyclobutene (BCB) resin, or formed of a photosensitive insulating layer or the like. Alternatively, stress buffer layer 119 may be made of a material having elasticity in an amount enough to buffer stress P that is externally applied to resistive element 100f. The resistance-value stabilization structure according to this variation is a structure in which stress buffer layer 119 has the above-described configuration.

Since the above-described configuration allows the buffering of stress that is externally applied to resistive element 100f, it is possible to suppress a change in the carrier concentration of two-dimensional electron gas layer 107 caused by the stress.

Namely, it is possible to provide resistive element 100f which exhibits a resistance value that is stable with less fluctuation.

Variation 7 of Embodiment 1

A resistance-value stabilization structure according to the present disclosure is not limited to the structure described in the aforementioned Embodiment 1 or any one of the variations thereof.

A resistance-value stabilization structure according to Variation 7 has an isolation layer that is disposed to surround a first nitride semiconductor layer and that includes inactive ions. Note that in this variation, detailed description of structural elements commonly shared with Embodiment 1 and the variations thereof will be omitted.

First, problems that could occur in resistive element 100 according to Embodiment 1 will be described with reference to FIG. 8A and FIG. 8B.

Figure 8A:
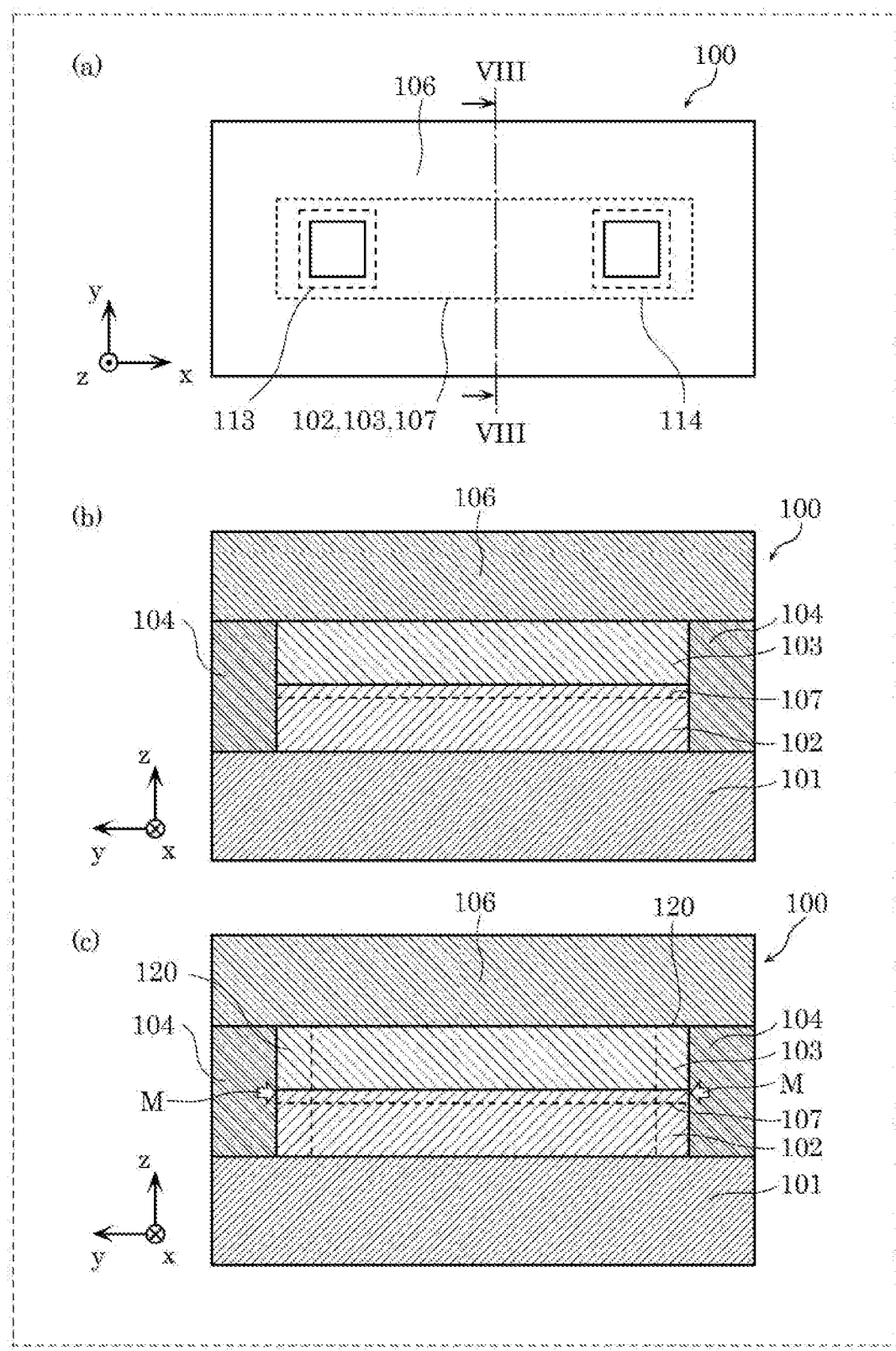
FIG. 8A is a diagram illustrating a migration of inactive ions in the resistive element according to Embodiment 1.

FIG. 8A is a diagram illustrating a migration of inactive ions in resistive element 100 according to Embodiment 1. More specifically, (a) in FIG. 8A is a plan view of resistive element 100. (b) in FIG. 8A is a cross-sectional view illustrating a cross section, which is taken along the line VIII-VIII in (a) in FIG. 8A, of resistive element 100 before inactive ions migrate. (c) in FIG. 8A is a cross-sectional view illustrating a cross section, which is taken along the line VIII-VIII in (a) in FIG. 8A, of resistive element 100 after inactive ions migrate. Note that inactive-ions migration directions M are indicated by arrows in (c) in FIG. 8A.

Inactive ions implanted for isolation may migrate due to heat treatment. When migrating inactive ions reach two-dimensional electron gas layer 107, ion migration region 120 to which the inactive ions have migrated is formed in resistive element 100. Since the inactive ions that have migrated inactivate carriers in two-dimensional electron gas layer 107, this narrows the region of an electric resistance element that functions as an electrical resistive component.

Figure 8B:
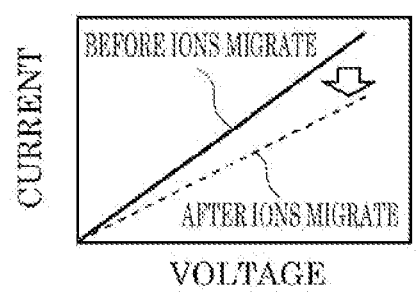
FIG. 8B is a conceptual diagram illustrating current-voltage characteristics of the resistive element according to Embodiment 1 before and after inactive ions migrate.

FIG. 8B is a conceptual diagram illustrating current-voltage characteristics of resistive element 100 according to Embodiment 1 before and after inactive ions migrate. As described above, since the carrier concentration of two-dimensional electron gas layer 107 decreases due to the migration of inactive ions, the resistance value of resistive element 100 may increase.

In view of the above, a resistance-value stabilization structure according to this variation is a structure related to an isolation layer.

Figure 9:
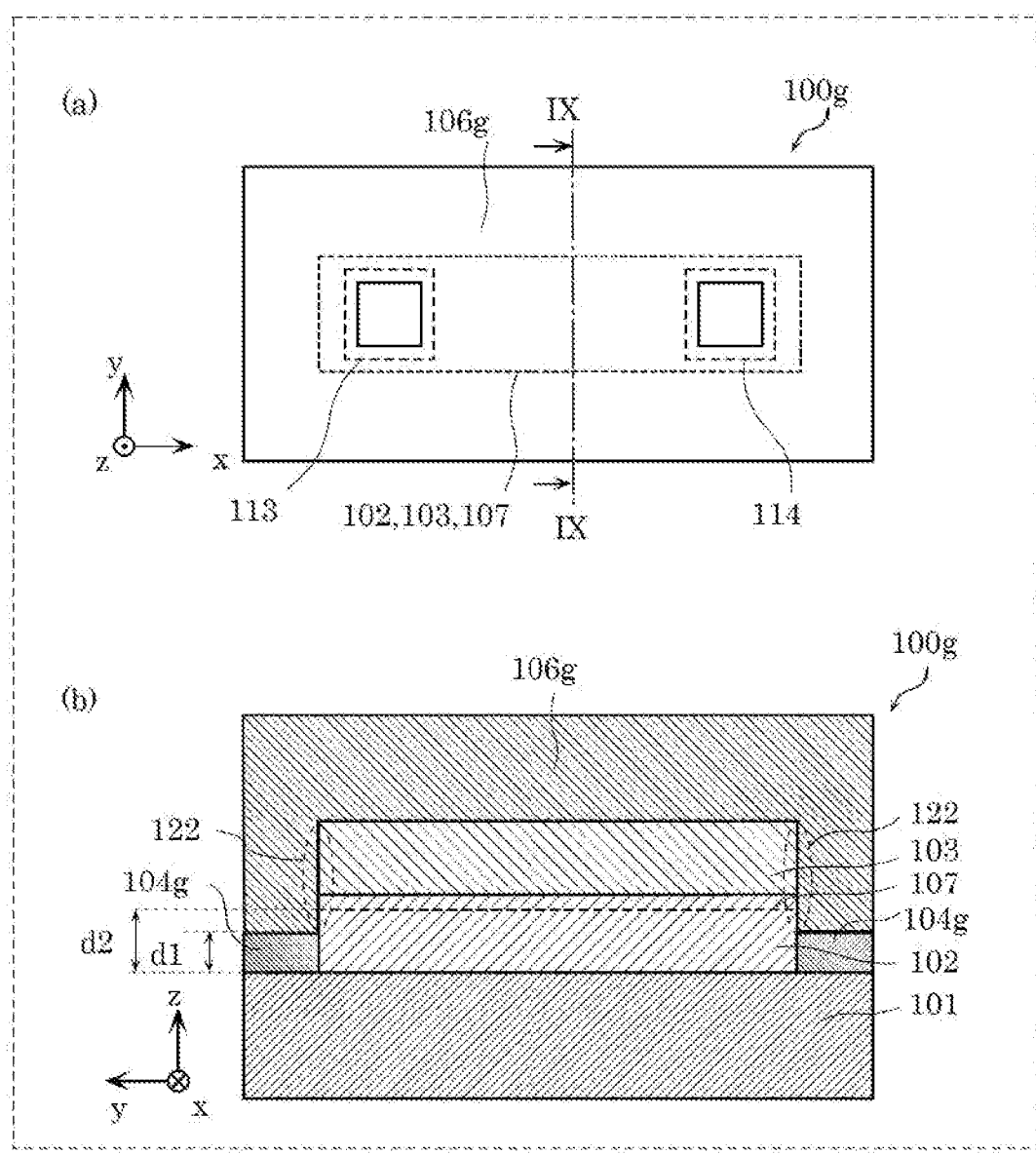
FIG. 9 illustrates a plan view and a cross-sectional view of a resistive element according to Variation 7 of Embodiment 1.

FIG. 9 illustrates a plan view and a cross-sectional view of resistive element 100g according to Variation 7 of Embodiment 1. More specifically, (a) in FIG. 9 is the plan view of resistive element 100g and (b) in FIG. 9 is the cross-sectional view illustrating a cross section of resistive element 100g taken along the line IX-IX in (a) in FIG. 9.

Resistive element 100g according to Variation 7 includes substrate 101, first nitride semiconductor layer 102, second nitride semiconductor layer 103, isolation layer 104g, first insulating layer 106g, two-dimensional electron gas layer 107, first electrode 113, and second electrode 114. Resistive element 100g has a resistance-value stabilization structure. In resistive element 100g, a conductive layer is not provided above first insulating layer 106g between first electrode 113 and second electrode 114 in plan view.

Isolation layer 104g is disposed to surround first nitride semiconductor layer 102 in the plan view and includes inactive ions. Moreover, distance d1 between the top surface of isolation layer 104g and the top surface of substrate 101 is less than distance d2 between the bottom surface of two-dimensional electron gas layer 107 and the top surface of substrate 101. In other words, in this variation, isolation layer 104g is not in contact with two-dimensional electron gas layer 107. The resistance-value stabilization structure according to this variation is a structure in which isolation layer 104g has the above-described configuration.

Alternatively, first insulating layer 106g may be disposed to cover the top surface of second nitride semiconductor layer 103 and lateral surfaces of first nitride semiconductor layer 102, two-dimensional electron gas layer 107, and second nitride semiconductor layer 103.

Such resistive element 100g according to this variation is manufactured as in the following example. First, first nitride semiconductor layer 102 and second nitride semiconductor layer 103 are sequentially stacked on the top surface of substrate 101 (two-dimensional electron gas layer 107 is also formed in this process). Next, a portion of first nitride semiconductor layer 102 and a portion of second nitride semiconductor layer 103 are etched. Specifically, the portions of second nitride semiconductor layer 103 and first nitride semiconductor layer 102 in a region extending from the top surface of second nitride semiconductor layer 103 to the middle of first nitride semiconductor layer 102 are etched so that two-dimensional electron gas layer 107 is exposed at the lateral surface of first nitride semiconductor layer 102. With this, mesa structure 122 is formed in first nitride semiconductor layer 102 and second nitride semiconductor layer 103. Subsequently, ions are implanted in first nitride semiconductor layer 102 that remains after the etching. With first nitride semiconductor layer 102 being inactivated, isolation layer 104g is formed.

In resistive element 100g, since there is no chance that an ion-implanted region (i.e., isolation layer 104g) comes in contact with two-dimensional electron gas layer 107, it is possible to suppress the migration of inactive ions to two-dimensional electron gas layer 107. Namely, it is possible to provide resistive element 100g which exhibits a resistance value that is stable with less fluctuation.

Variation 8 of Embodiment 1

A resistance-value stabilization structure according to the present disclosure is not limited to the structure described in the aforementioned Embodiment 1 or any one of the variations thereof.

A resistance-value stabilization structure according to Variation 8 has a high resistance layer. Note that in this variation, detailed description of structural elements commonly shared with Embodiment 1 and the variations thereof will be omitted.

First, problems that could occur in resistive element 100 according to Embodiment 1 will be described with reference to FIG. 10A and FIG. 10B.

Figure 10A:
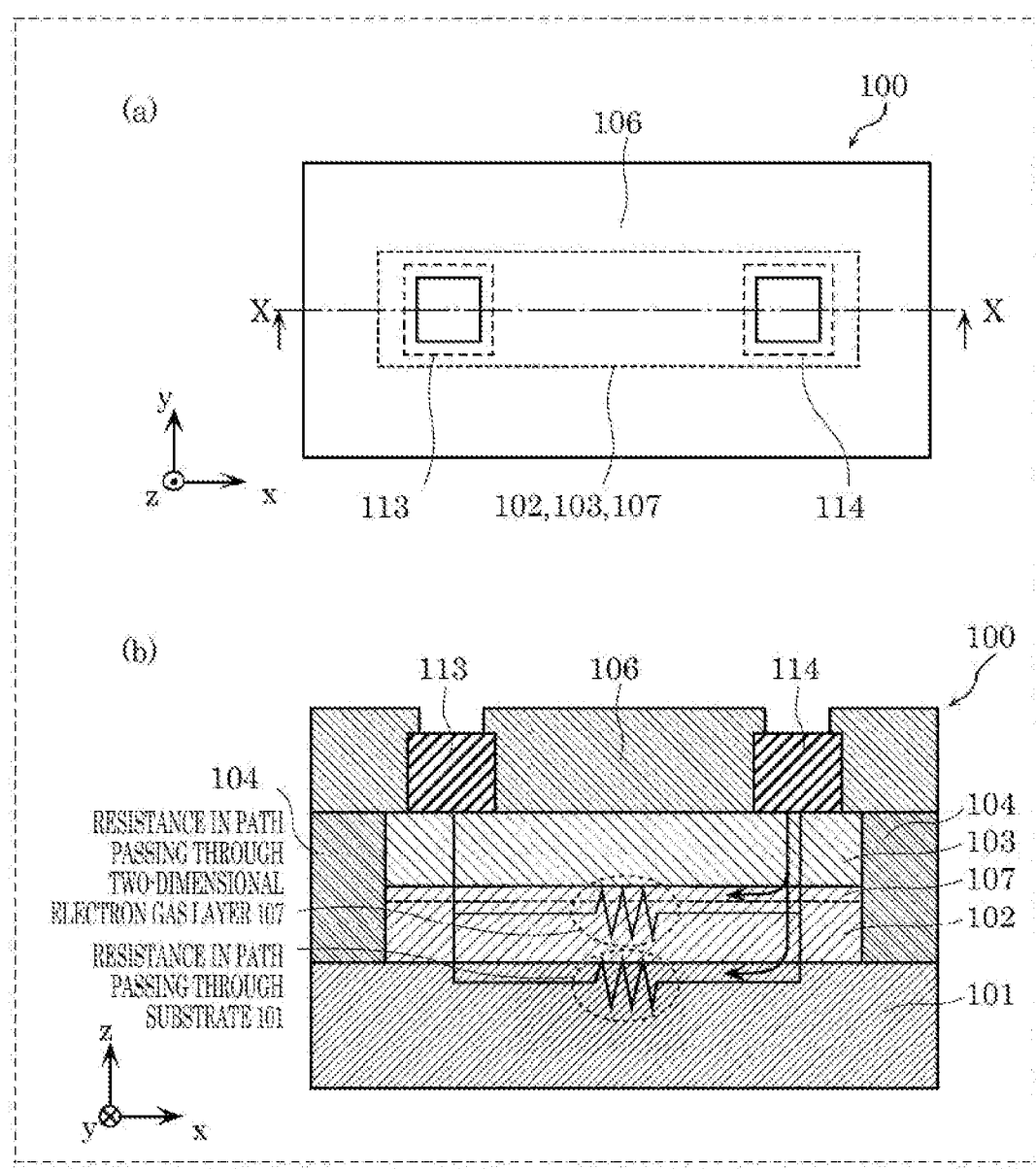
FIG. 10A is a diagram illustrating electrical resistances in the resistive element according to Embodiment 1.

FIG. 10A is a diagram illustrating electrical resistances in resistive element 100 according to Embodiment 1. More specifically, (a) in FIG. 10A is a plan view of resistive element 100. (b) in FIG. 10A is a cross-sectional view illustrating a cross section of resistive element 100 taken along the line X-X in (a) in FIG. 10A.

At ordinary temperature, a current path of resistive element 100 that includes two-dimensional electron gas layer 107 as an electric resistance element is a path passing through one of first electrode 113 and second electrode 114, two-dimensional electron gas layer 107, and the other of first electrode 113 and second electrode 114.

However, when substrate 101 is an Si substrate, the resistance value of substrate 101 decreases at high temperature. Therefore, a current path passing through one of first electrode 113 and second electrode 114, substrate 101, and the other of first electrode 113 and second electrode 114 may be newly generated as a current path of resistive element 100 that includes two-dimensional electron gas layer 107 as an electric resistance element.

Figure 10B:
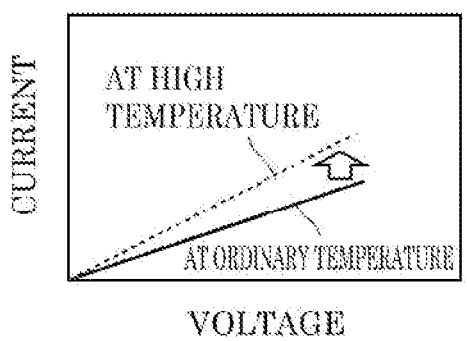
FIG. 10B is a conceptual diagram illustrating current-voltage characteristics of the resistive element according to Embodiment 1 at ordinary temperature or at high temperature.

FIG. 10B is a conceptual diagram illustrating current-voltage characteristics of resistive element 100 according to Embodiment 1 at ordinary temperature or at high temperature. As described above, the resistance value of resistive element 100 at high temperature may be lower than that at ordinary temperature, and as a result, the current value of resistive element 100 at high temperature may become higher than that at ordinary temperature.

In view of the above, the resistance-value stabilization structure according to this variation is a structure related to a high resistance layer.

Figure 11:
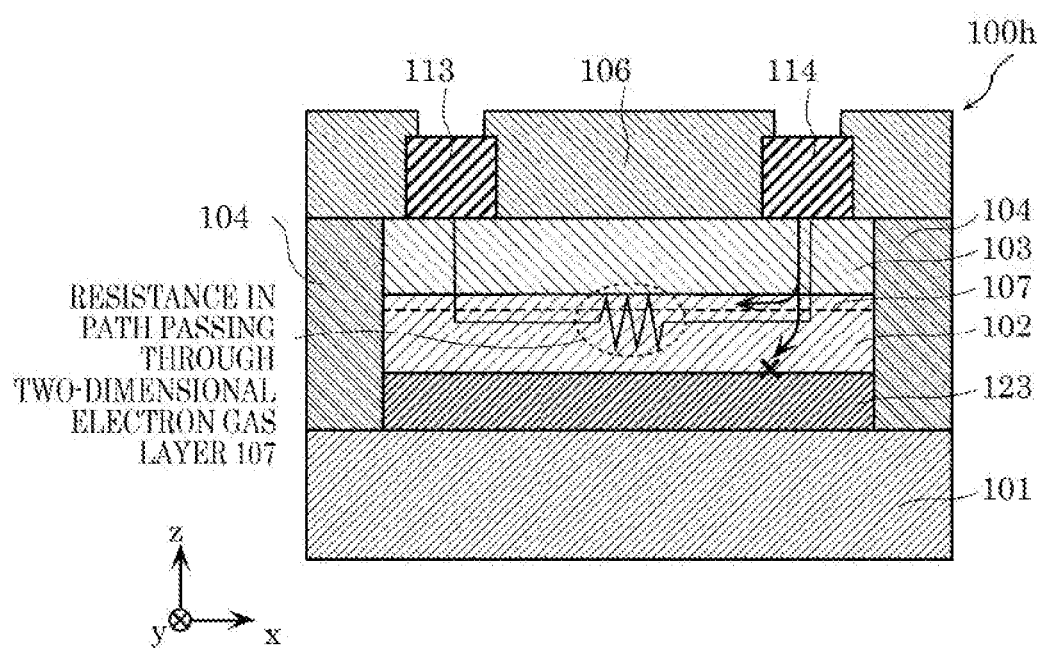
FIG. 11 illustrates a cross-sectional view of a resistive element according to Variation 8 of Embodiment 1.

FIG. 11 illustrates a cross-sectional view of resistive element 100h according to Variation 8 of Embodiment 1. More specifically, FIG. 11 is a diagram corresponding to the cross-sectional view in (b) in FIG. 1.

Resistive element 100h according to this variation includes the structural elements included in resistive element 100 according to Embodiment 1 and high resistance layer 123. In resistive element 100h according to this variation, a conductive layer is not provided above first insulating layer 106 between first electrode 113 and second electrode 114 in plan view.

High resistance layer 123 is disposed between substrate 101 and first nitride semiconductor layer 102. High resistance layer 123 has electrical resistivity higher than that of substrate 101. The electrical resistivity of high resistance layer 123 may be, for example, at least 1000 Ωcm. High resistance layer 123 may be a layer (e.g., an AlGaN layer or an AlN layer) having a band gap larger than that of first nitride semiconductor layer 102 or may be a layer having a super-lattice structure including both AlN and AlGaN. Alternatively, high resistance layer 123 may be a layer formed by injecting, with high acceleration, a light element such as helium or hydrogen into a region on the substrate 101 side in first nitride semiconductor layer 102, or may be an insulating layer formed on the top surface of substrate 101 by an epitaxial method. The resistance-value stabilization structure according to this variation is a structure in which high resistance layer 123 has the above-described configuration.

With this structure, a current does not flow through high resistance layer 123 even when the resistance of substrate 101 is changed from high to low at high temperature. It is therefore possible to suppress the fluctuation of the resistance value of resistive element 100h.

Namely, it is possible to provide resistive element 100h which exhibits a resistance value that is stable with less fluctuation.

Variation 9 of Embodiment 1

A resistance-value stabilization structure according to the present disclosure is not limited to the aforementioned Embodiment 1 or any one of the variations thereof.

A resistance-value stabilization structure according to Variation 9 has a low temperature-characteristic resistive element portion. Note that in this variation, detailed description of structural elements commonly shared with Embodiment 1 and the variations thereof will be omitted.

First, the background of how a low temperature-characteristic resistive element portion has come into use will be described.

A resistive element that includes a two-dimensional electron gas layer as a resistance element is characterized by a large increase of its resistance value caused by temperature rise (i.e., the temperature coefficient of the two-dimensional electron gas layer is high), as mentioned in PTL 1. This is because the mobility of the two-dimensional electron gas layer decreases with temperature rise. With a circuit configuration advantageously utilizing such a change, the aforementioned increase in resistance value is not a problem, but it becomes one in the case of using a two dimensional electron gas layer simply as a resistive element which exhibits a constant value.

Next, the variation for overcoming the problem will be described.

Figure 12:
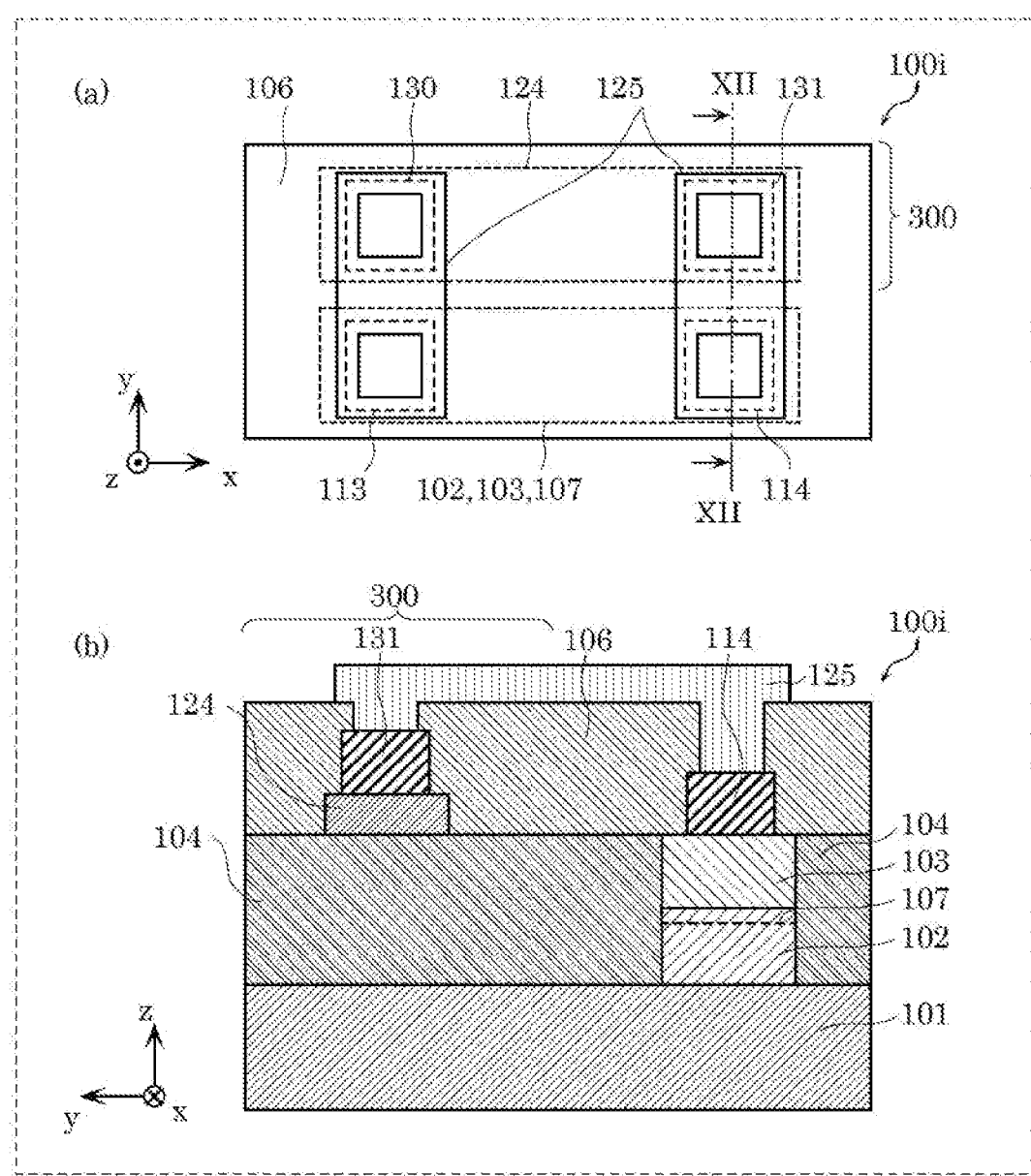
FIG. 12 illustrates a plan view and a cross-sectional view of a resistive element according to Variation 9 of Embodiment 1.

FIG. 12 illustrates a plan view and a cross-sectional view of resistive element 100i according to Variation 9 of Embodiment 1. More specifically, (a) in FIG. 12 is the plan view of resistive element 100i and (b) in FIG. 12 is the cross-sectional view illustrating a cross section of resistive element 100i taken along the line XII-XII in (a) in FIG. 12.

Resistive element 100i according to this variation includes the structural elements included in resistive element 100 according to Embodiment 1, low temperature-characteristic resistive element portion 300, and two interconnect layers 125. In resistive element 100i according to this variation, a conductive layer is not provided above first insulating layer 106 between first electrode 113 and second electrode 114 in plan view.

Low temperature-characteristic resistive element portion 300 is disposed above substrate 101. As illustrated in FIG. 12, low temperature-characteristic resistive element portion 300 includes isolation layer 104, first insulating layer 106, thin-film resistive layer 124, third electrode 130, and fourth electrode 131.

Thin-film resistive layer 124 is disposed above isolation layer 104 and is made of a material having a temperature coefficient lower than that of two-dimensional electron gas layer 107. Thin-film resistive layer 124 is, for example, a metal resistance made of TiN. Thin-film resistive layer 124 may be, for example, made of Al, Au, W, Ti, Mo, Ta, TaN, Pt, Pd, Ni, Cr, Fe, Ag, Cu, SiN, or AlN. Thin-film resistive layer 124 may be a semiconductor resistance made of Si having a negative temperature coefficient. Thin-film resistive layer 124 may be made of, for example, SiN or WSiN having a high composition ratio of Si. The width, thickness, and length of thin-film resistive layer 124 are determined so that a desired resistance value can be obtained. Third electrode 130 and fourth electrode 140 are stacked above thin-film resistive layer 124.

Third electrode 130 and fourth electrode 131 are leading electrodes disposed above thin-film resistive layer 124. A space is provided between third electrode 130 and fourth electrode 131 in the plan view. Third electrode 130 and fourth electrode 131 are electrically connected to thin-film resistive layer 124.

Third electrode 130 and fourth electrode 131 are made of a material having electrical conduction. Third electrode 130 and fourth electrode 131 may be made of, for example, metal. Alternatively, third electrode 130 and fourth electrode 131 may each have a layered structure including at least one of Ti, Al, Cr, or Au. Note that third electrode 130 and fourth electrode 131 may, but not limited to, be made of the same material.

First insulating layer 106 is disposed between third electrode 130 and fourth electrode 131 in the plan view and in contact with the top surface of isolation layer 104. First insulating layer 106 is disposed to surround thin-film resistive layer 124, third electrode 130, and fourth electrode 131.

The temperature coefficient of low temperature-characteristic resistive element portion 300 thus configured is lower than that of two-dimensional electron gas layer 107 (an increase in resistance value due to temperature rise is small). Alternatively, the temperature coefficient of low temperature-characteristic resistive element portion 300 becomes negative (the resistance value decreases due to temperature rise).

The temperature coefficient of low temperature-characteristic resistive element portion 300 is lower than that of two-dimensional electron gas layer 107. Namely, even at high temperature, the resistance value of low temperature-characteristic resistive element portion 300 is less apt to increase than that of two-dimensional electron gas layer 107.

First electrode 113 is connected to third electrode 130 and second electrode 114 is connected to fourth electrode 131. Specifically, the electrodes are connected by two interconnect layers 125. For example, one of two interconnect layers 125 connects first electrode 131 to third electrode 130 and the other of two interconnect layers 125 connects second electrode 114 to fourth electrode 131. Stated differently, first electrode 113, two-dimensional electron gas layer 107, and second electrode 114 are connected to low temperature-characteristic resistive element portion 300 in parallel in this variation. Two interconnect layers 125 may be disposed above and over first insulating layer 106 and thus connect first electrode 113 to third electrode 130 and second electrode 114 to fourth electrode 131, respectively. Two interconnect layers 125 are disposed apart from each other.

Two interconnect layers 125 are made of a material having electrical conduction. Two interconnect layers 125 may be made of, for example, metal. Two interconnect layers 125 may each have a layered structure including, for example, at least one of Al, Au, Ag, or Cu. Note that two interconnect layers 125 may, but not limited to, be made of the same material. The resistance-value stabilization structure according to this variation is a structure in which low temperature-characteristic resistive element portion 300 has the above-described configuration.

With such a resistance-value stabilization structure, a resistance value obtained by merging the electric resistance element of two-dimensional electron gas layer 107 and low temperature-characteristic resistive element portion 300 is less apt to change even at high temperature, compared to the resistance value of the electric resistance element of two-dimensional electron gas layer 107 alone.

Namely, it is possible to provide resistive element 100i which exhibits a resistance value that is stable with less fluctuation.

Variation 10 of Embodiment 1

A resistance-value stabilization structure according to the present disclosure is not limited to the structure described in the aforementioned Embodiment 1 or any one of the variations thereof.

A resistance-value stabilization structure according to Variation 10 is a structure related to a first electrode and a second electrode. Note that in this variation, detailed description of structural elements commonly shared with Embodiment 1 and the variations thereof will be omitted.

Figure 13:
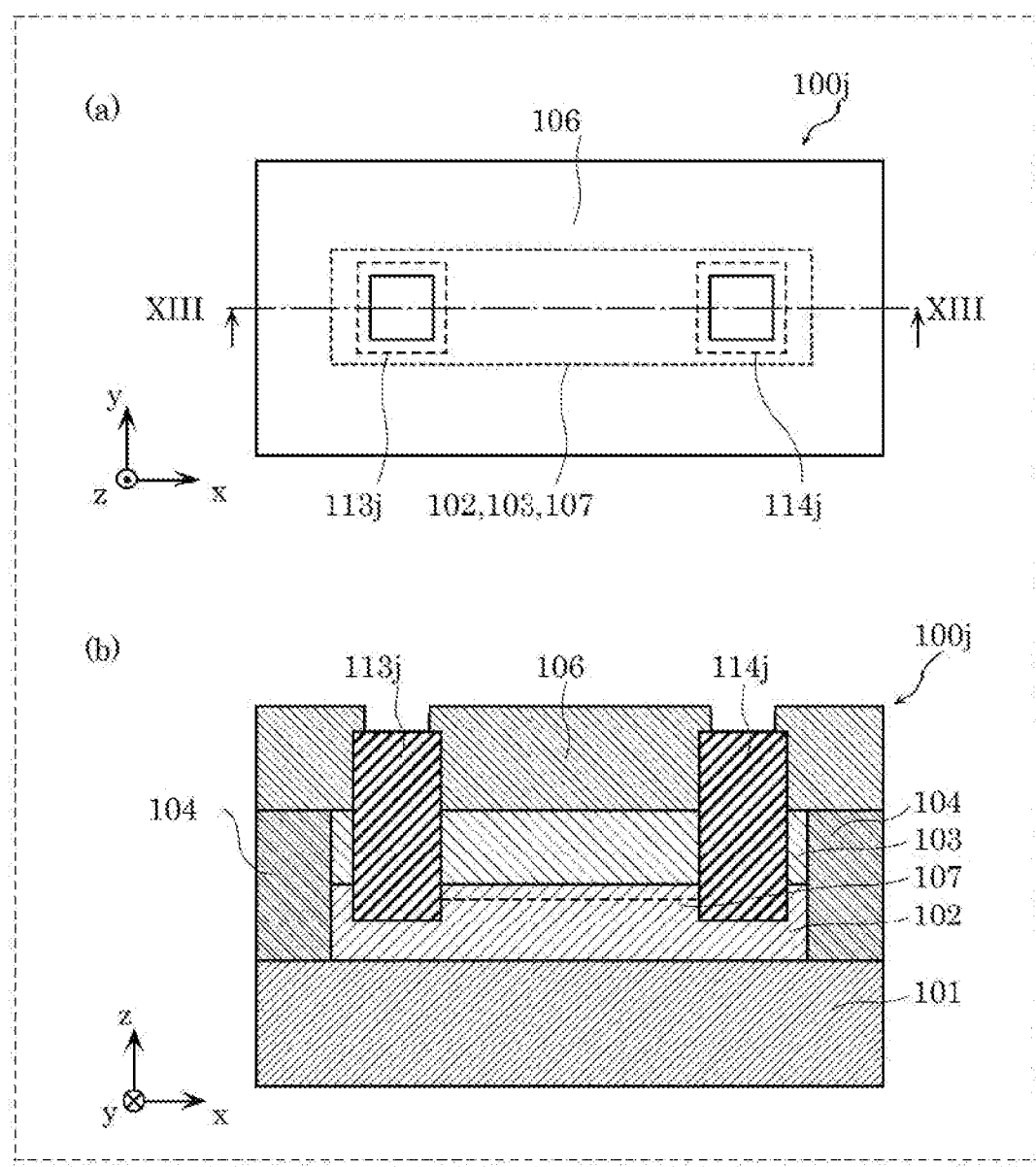
FIG. 13 illustrates a plan view and a cross-sectional view of a resistive element according to Variation 10 of Embodiment 1.

FIG. 13 illustrates a plan view and a cross-sectional view of resistive element 100j according to Variation 10 of Embodiment 1. More specifically, (a) in FIG. 13 is the plan view of resistive element 100j and (b) in FIG. 13 is the cross-sectional view illustrating a cross section of resistive element 100j taken along the line XIII-XIII in (a) in FIG. 13.

Resistive element 100j according to Variation 10 includes substrate 101, first nitride semiconductor layer 102, second nitride semiconductor layer 103, isolation layer 104, first insulating layer 106, two-dimensional electron gas layer 107, first electrode 113j, and second electrode 114j. Resistive element 100j has a resistance-value stabilization structure. In resistive element 100j, a conductive layer is not provided above insulating layer 106 between first electrode 113j and second electrode 114j in plan view.

In this variation, each of first electrode 113j and second electrode 114j has an embedded portion extending from the top surface of second nitride semiconductor layer 103 and including a portion of first nitride semiconductor layer 102 such that the electrode contacts two-dimensional electron gas layer 107. Stated differently, a portion, of first electrode 113j or second electrode 114j, which extends from the top surface of second nitride semiconductor layer 103 and reaches two-dimensional electron gas layer 107 is embedded.

In this case also, two-dimensional electron gas layer 107 between first electrode 113j and second electrode 114j that are disposed apart from each other in the plan view is a resistance element.

With this configuration, it is possible to remove, from the resistive components of first electrode 113j and second electrode 114j, contact resistive components that fluctuate depending on the sizes of first electrode 113j and second electrode 114j, and thus stabilize the resistance value of two-dimensional electron gas layer 107. In addition, a distance between first electrode 113j and second electrode 114j becomes constant. The resistance-value stabilization structure according to this variation is a structure in which first electrode 113j and second electrode 114j have the above-described configuration.

Accordingly, the resistance value of two-dimensional electron gas layer 107 is less apt to depend on the sizes of first electrode 113j and second electrode 114j.

Namely, it is possible to provide resistive element 100j which exhibits a resistance value that is stable with less fluctuation.

Variation 11 of Embodiment 1

A resistance-value stabilization structure according to the present disclosure is not limited to the aforementioned Embodiment 1 or any one of the variations thereof.

A resistance-value stabilization structure according to Variation 11 is a structure related to a first insulating layer. Note that in this variation, detailed description of structural elements commonly shared with Embodiment 1 and the variations thereof will be omitted.

Figure 14:
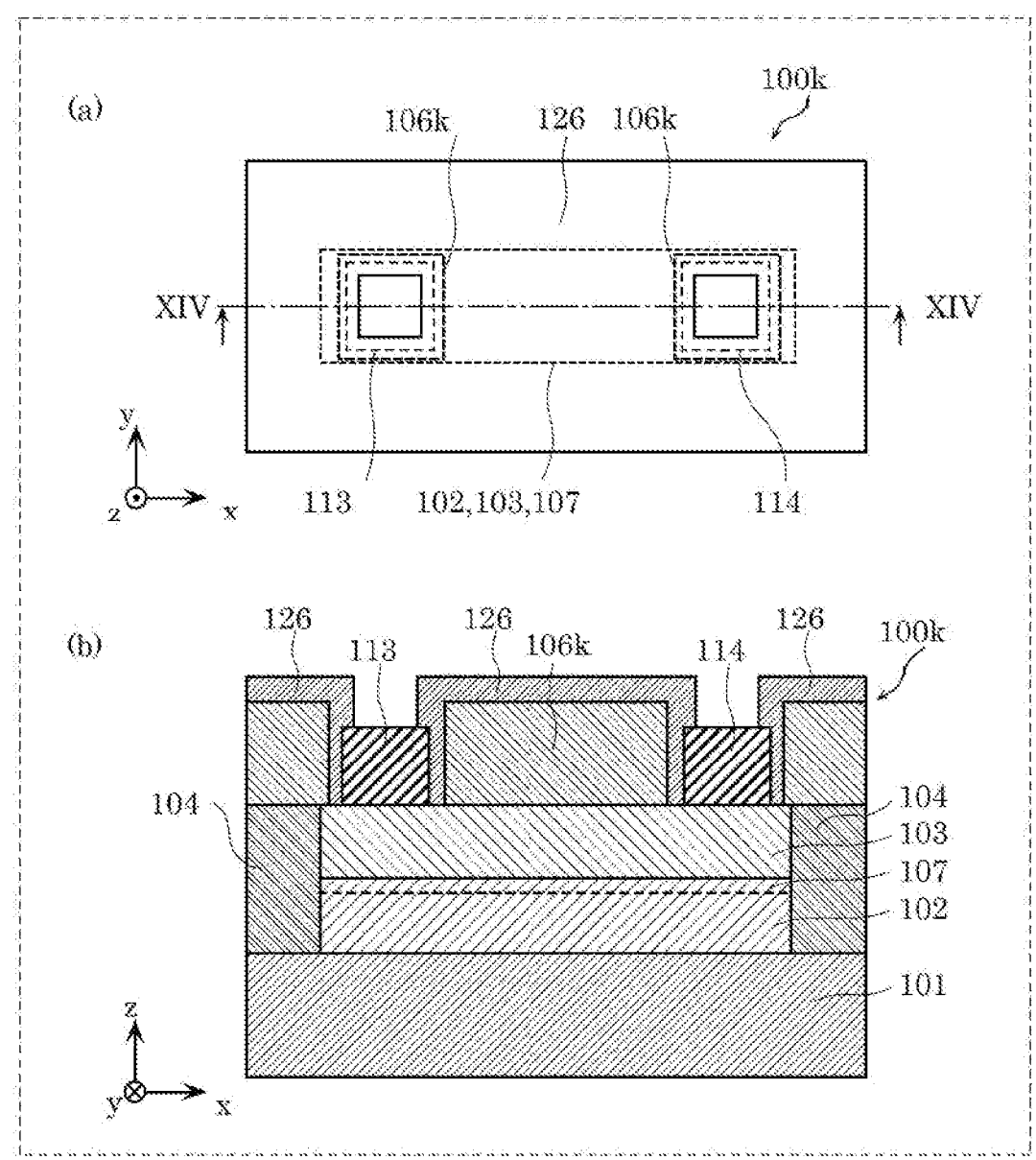
FIG. 14 illustrates a plan view and a cross-sectional view of a resistive element according to Variation 11 of Embodiment 1.

FIG. 14 illustrates a plan view and a cross-sectional view of resistive element 100k according to Variation 11 of Embodiment 1. More specifically, (a) in FIG. 14 is the plan view of resistive element 100k and (b) in FIG. 14 is the cross-sectional view illustrating a cross section of resistive element 100k taken along the line XIV-XIV in (a) in FIG. 14.

Resistive element 100k includes substrate 101, first nitride semiconductor layer 102, second nitride semiconductor layer 103, isolation layer 104, first insulating layer 106k, second insulating layer 126, two-dimensional electron gas layer 107, first electrode 113, and second electrode 114. Resistive element 100k has a resistance-value stabilization structure. In resistive element 100k, a conductive layer is not provided above insulating layer 106k between first electrode 113 and second electrode 114 in plan view.

In this variation, first insulating layer 106k is disposed apart from first electrode 113 and second electrode 114. In other words, first insulating layer 106k is neither in contact with first electrode 113 nor with second electrode 114.

Second insulating layer 126 is disposed above second nitride semiconductor layer 103 to fill a space between first insulating layer 106k and first electrode 113 and a space between first insulating layer 106k and second electrode 114. Moreover, second insulating layer 126 is disposed to surround first electrode 113 and second electrode 114 in the plan view.

Second insulating layer 126 may be disposed above first insulating layer 106k. As illustrated in (b) in FIG. 14, second insulating layer 126 is provided neither above first electrode 113 nor above second electrode 114, and opening portions are provided. For this reason, the top surfaces of first electrode 113 and second electrode 114 are exposed.

Second insulating layer 126 is made of SiN. Second insulating layer 126 may be made of, for example, $SiO_2$, SiON, or AlN. Second insulating layer 126 and first insulating layer 106k may, but not limited to, have the same materials and the same compositions. The resistance-value stabilization structure according to this variation is a structure in which first insulating layer 106k has the above-described configuration.

A method of manufacturing resistive element 100k according to this variation will be briefly described herein. Heat treatment of approximately 500 Celsius degrees is required for ohmically connecting first electrode 113 and second electrode 114 to two-dimensional electron gas layer 107. When first electrode 113 and second electrode 114 are in contact with first insulating layer 106k, for example, metal constituting first electrode 113 and second electrode 114 may be heat dissipated throughout first insulating layer 106k during the heat treatment. When the metal dissipates throughout first insulating layer 106k, this might affect the reliability of resistive element 100k and causes a problem such as a short circuit between first electrode 113 and second electrode 114 or a decrease in a breakdown voltage of first insulating layer 106k. In view of this, in the manufacturing method of resistive element 100k according to this variation, first insulating layer 106k is formed so as not to contact first electrode 113 and second electrode 114 and the heat treatment is subsequently carried out, as in the above-described configuration. After that, second insulating layer 126 is formed.

With the above manufacturing method, it is possible to suppress the diffusion of metal throughout first insulating layer 106k, which is caused by heat treatment, and achieve resistive element 100k that is highly reliable.

Embodiment 2

The following describes a power amplifier circuit for which the resistive element according to Embodiment 1 or any one of the variations thereof is used. It should be noted that in this embodiment, detailed description of structural elements commonly shared with Embodiment 1 and the variations thereof will be omitted.

Figure 15A:
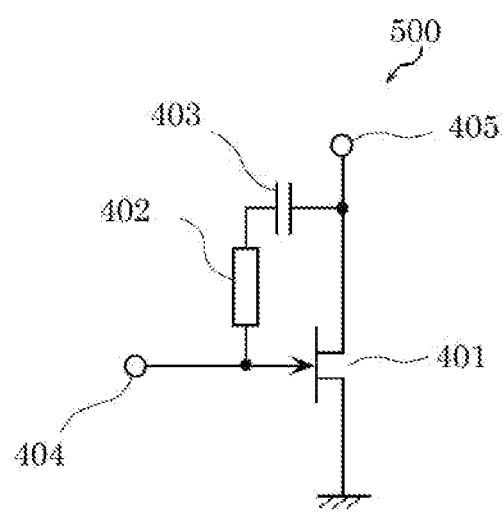
FIG. 15A is a circuit diagram illustrating a power amplifier circuit according to Embodiment 2.
Figure 15B:
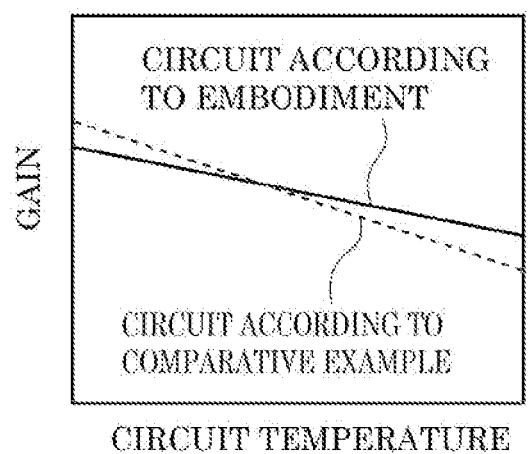
FIG. 15B is a diagram illustrating temperature dependence of a gain of a field effect transistor included in the power amplifier circuit according to Embodiment 2.

FIG. 15A is a circuit diagram illustrating power amplifier circuit 500 according to Embodiment 2. FIG. 15B is a diagram illustrating temperature dependence of a gain of power amplifier circuit 500 according to Embodiment 2. Note that a temperature indicated in FIG. 15B is a temperature of power amplifier circuit 500.

Power amplifier circuit 500 includes resistive element 100 according to Embodiment 1, and field effect transistor 401 that is disposed above substrate 101 included in resistive element 100, and capacitor 403.

Field effect transistor 401 includes a source electrode, a drain electrode, and a gate electrode. One of first electrode 113 and second electrode 114 included in resistive element 100 is electrically connected to the gate electrode whereas the other of first electrode 113 and second electrode 114 is electrically connected to the drain electrode via capacitor 403.

Power amplifier circuit 500 may include gate terminal 404 and drain terminal 405 electrically connected to the gate electrode and the drain electrode of field effect transistor 401, respectively, and resistance 402. In this embodiment, resistive element 100 is resistance 402 illustrated in FIG. 15A.

A negative feedback circuit will be described herein. A negative feedback circuit, which attenuates an output signal with feedback resistance to feedback-input the signal to an input side, is used for the stabilization of a radio frequency circuit. In the negative feedback circuit, when a feedback resistance value decreases, the stability of power amplifier circuit 500 increases and the gain of power amplifier circuit 500 decreases.

In this embodiment, a negative feedback circuit including resistance 402 and capacitor 403 is connected to gate terminal 404 and drain terminal 405 of field effect transistor 401 for signal amplifier.

The gain of power amplifier circuit 500 that uses semiconductors decreases due to a decrease in carrier mobility at high temperature. In a circuit according to a comparative example, which has resistance with a lower temperature coefficient than resistance 402, for example, a gain fall at high temperature is large, as illustrated in FIG. 15B. Power amplifier circuit 500, however, has resistive element 100 including two-dimensional electron gas layer 107 having a high temperature coefficient. Accordingly, in power amplifier circuit 500, the resistance value of two-dimensional electron gas layer 107 increases at high temperature and an amount of feedback in the negative feedback circuit gets smaller, and this moderates a gain fall at high temperature.

Embodiment 3

The following describes a power amplifier circuit for which the resistive element according to Embodiment 1 or any one of the variations thereof is used. In Embodiment 2, the resistive element is included in the negative feedback circuit, but a resistive element according to the present disclosure is not limited to such a resistive element. In Embodiment 3, a resistive element is included in a bias circuit that supplies a gate voltage to a field effect transistor to set a drain current of the field effect transistor. It should be noted that in this embodiment, detailed description of structural elements commonly shared with Embodiment 1 and the variations thereof will be omitted.

Figure 16A:
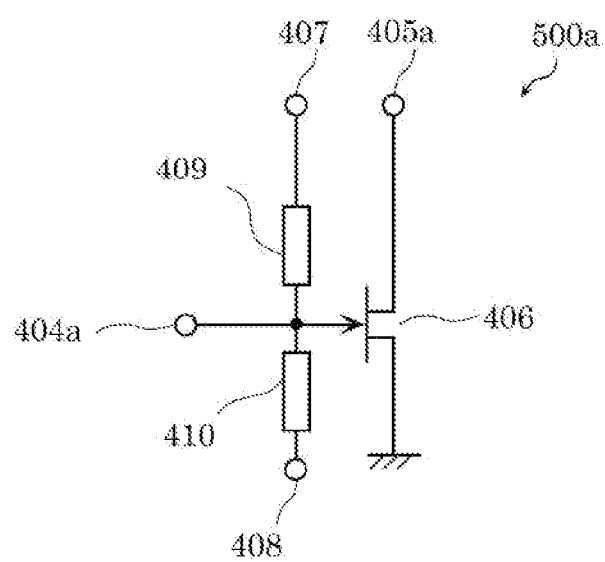
FIG. 16A is a circuit diagram illustrating a power amplifier circuit according to Embodiment 3.
Figure 16B:
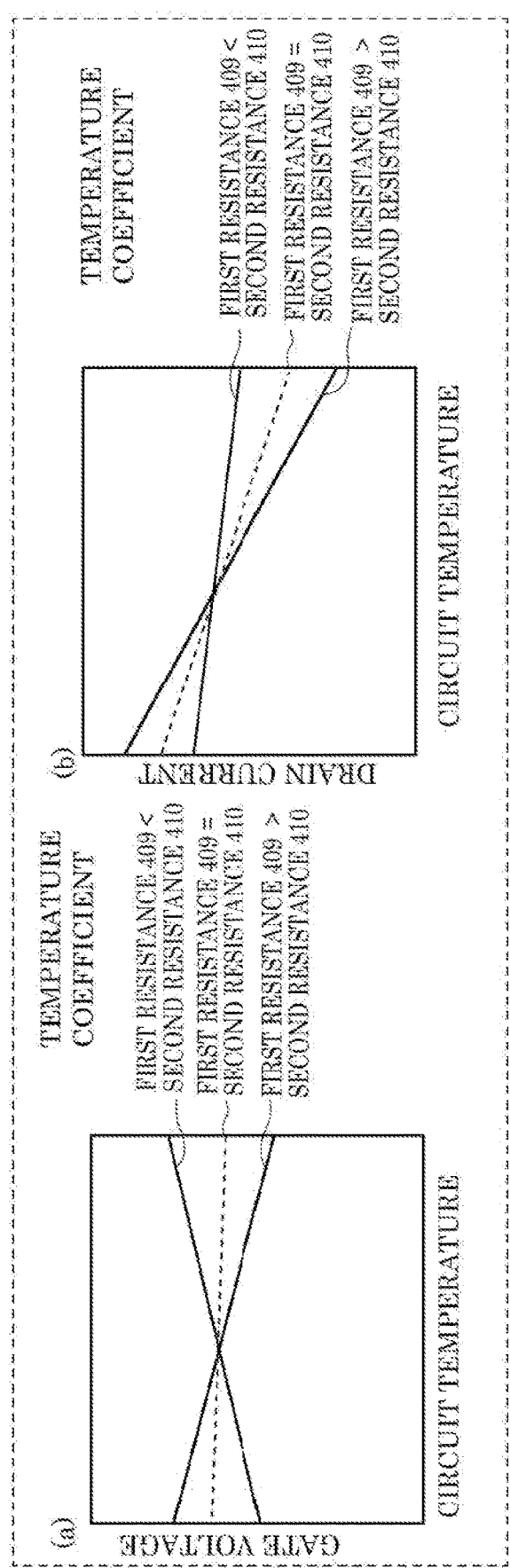
FIG. 16B is a diagram illustrating temperature dependences of a gate voltage and a drain current of a field effect transistor included in the power amplifier circuit according to Embodiment 3.

FIG. 16A is a circuit diagram illustrating power amplifier circuit 500a according to Embodiment 3. FIG. 16B is a diagram illustrating temperature dependences of a gate voltage and a drain current of field effect transistor 406 included in power amplifier circuit 500a according to Embodiment 3. More specifically, (a) in FIG. 16B illustrates temperature dependence of the gate voltage of field effect transistor 406 while (b) in FIG. 16B illustrates temperature dependence of the drain current of field effect transistor 406. Note that a temperature indicated in FIG. 16B is a temperature of power amplifier circuit 500a.

Power amplifier circuit 500a includes field effect transistor 406 and a bias circuit. Power amplifier circuit 500a may include first gate bias terminal 407, second gate bias terminal 408, first resistance 409, second resistance 410, and gate terminal 404a and drain terminal 405a connected to the gate electrode and the drain electrode of field effect transistor 406, respectively.

The bias circuit includes resistive element 100 described in Embodiment 1. The bias circuit supplies a gate voltage to field effect transistor 406 to set a drain current of field effect transistor 406.

Resistive element 100 is at least one of first resistance 409 or second resistance 410.

Field effect transistor 406 is disposed above substrate 101 included in resistive element 100. Field effect transistor 406 includes a source electrode, a drain electrode, and a gate electrode.

A voltage higher than that of second gate bias terminal 408 may be applied to first gate bias terminal 407 and one of first gate bias terminal 407 and second gate bias terminal 408 may be grounded.

There is, for example, a case where second resistance 410 is resistive element 100 and the temperature coefficient of first resistance 409 is lower than that of second resistance 410. In this case, the gate voltage of field effect transistor 406 rises due to temperature rise and it is possible to increase the drain current of field effect transistor 406 at high temperature, compared to a case where the temperature coefficients of first resistance 409 and second resistance 410 are same, as illustrated in FIG. 16B.

Another case is that first resistance 409 is resistive element 100 and the temperature coefficient of first resistance 409 is higher than that of second resistance 410. In this case, the gate voltage of field effect transistor 406 decreases due to temperature rise and it is possible to decrease the drain current of field effect transistor 406 at high temperature, compared to the case where the temperature coefficients of first resistance 409 and second resistance 410 are same.

With the above-described configuration, it is possible to easily control the drain current of field effect transistor 406.

Note that first resistance 409 and second resistance 410 may be each resistive element 100. Note that in this case, the temperature coefficient of first resistance 409 may be different from that of second resistance 410.

Embodiment 4

Although Embodiment 1 or each of the variations thereof has illustrated an example of the resistive element in which a conductive layer is not provided above the first insulating layer between the first electrode and the second electrode in plan view, a resistive element according to the present disclosure is not limited to this example. A resistive element according to Embodiment 4 includes a conduction control layer and is thus different from the resistive element described in Embodiment 1. It should be noted that in this embodiment, detailed description of structural elements commonly shared with Embodiment 1 and the variations thereof will be omitted.

Figure 17:
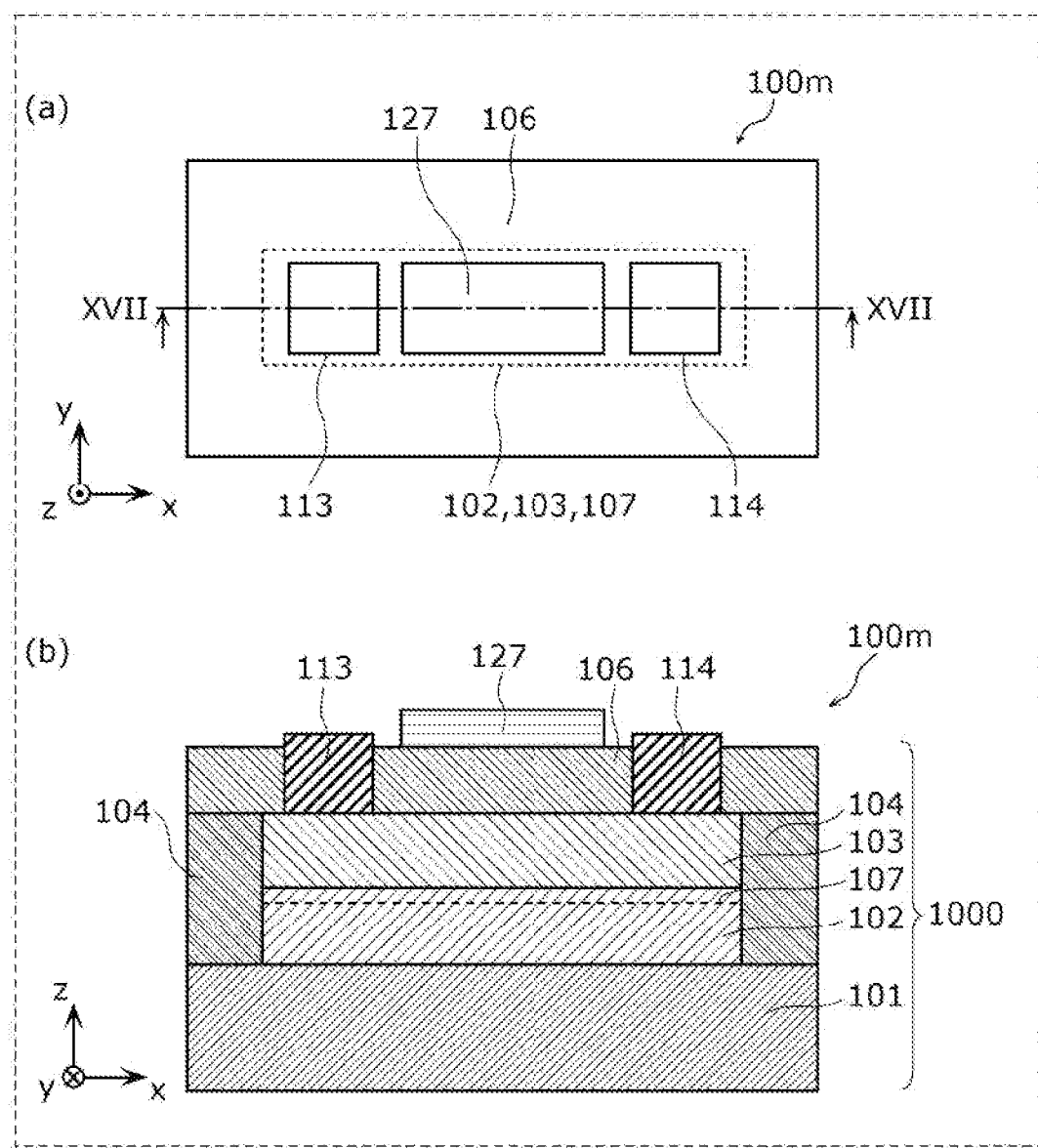
FIG. 17 illustrates a plan view and a cross-sectional view of a resistive element according to Embodiment 4.

FIG. 17 illustrates a plan view and a cross-sectional view of resistive element 100m according to Embodiment 4. More specifically, (a) in FIG. 17 is the plan view of resistive element 100m and (b) in FIG. 17 is the cross-sectional view illustrating a cross section of resistive element 100m taken along the line XVII-XVII in (a) in FIG. 17.

Resistive element 100m includes resistive element portion 1000 and a conduction control layer (hereinafter referred to as first conduction control layer 127). Resistive element 100m has a resistance-value stabilization structure. Resistive element portion 1000 includes substrate 101, first nitride semiconductor layer 102, second nitride semiconductor layer 103, isolation layer 104, first insulating layer 106, two-dimensional electron gas layer 107, first electrode 113, and second electrode 114.

First conduction control layer 127 is disposed above an insulating layer (first insulating layer 106) between first electrode 113 and second electrode 114 in plan view. Note that first conduction control layer 127 may be disposed in a region above second nitride semiconductor layer 103 and between first electrode 113 and second electrode 114 in the plan view. A length of first conduction control layer 127 in a direction in which first electrode 113 and second electrode 114 are aligned in the plan view (i.e., a length in the x-axis direction in FIG. 17) is at least half the space between first electrode 113 and second electrode 114. The length of first conduction control layer 127 in the aforementioned direction may be at least the third-fourths of the space between first electrode 113 and second electrode 114, as illustrated in FIG. 17.

First conduction control layer 127 supplies an electric field to two-dimensional electron gas layer 107 to control the resistance value of an electric resistance element, in accordance with a voltage supplied from a source outside of resistive element portion 1000. In other words, first conduction control layer 127 is capable of intentionally controlling the resistance value of the electric resistance element.

Figure 18:
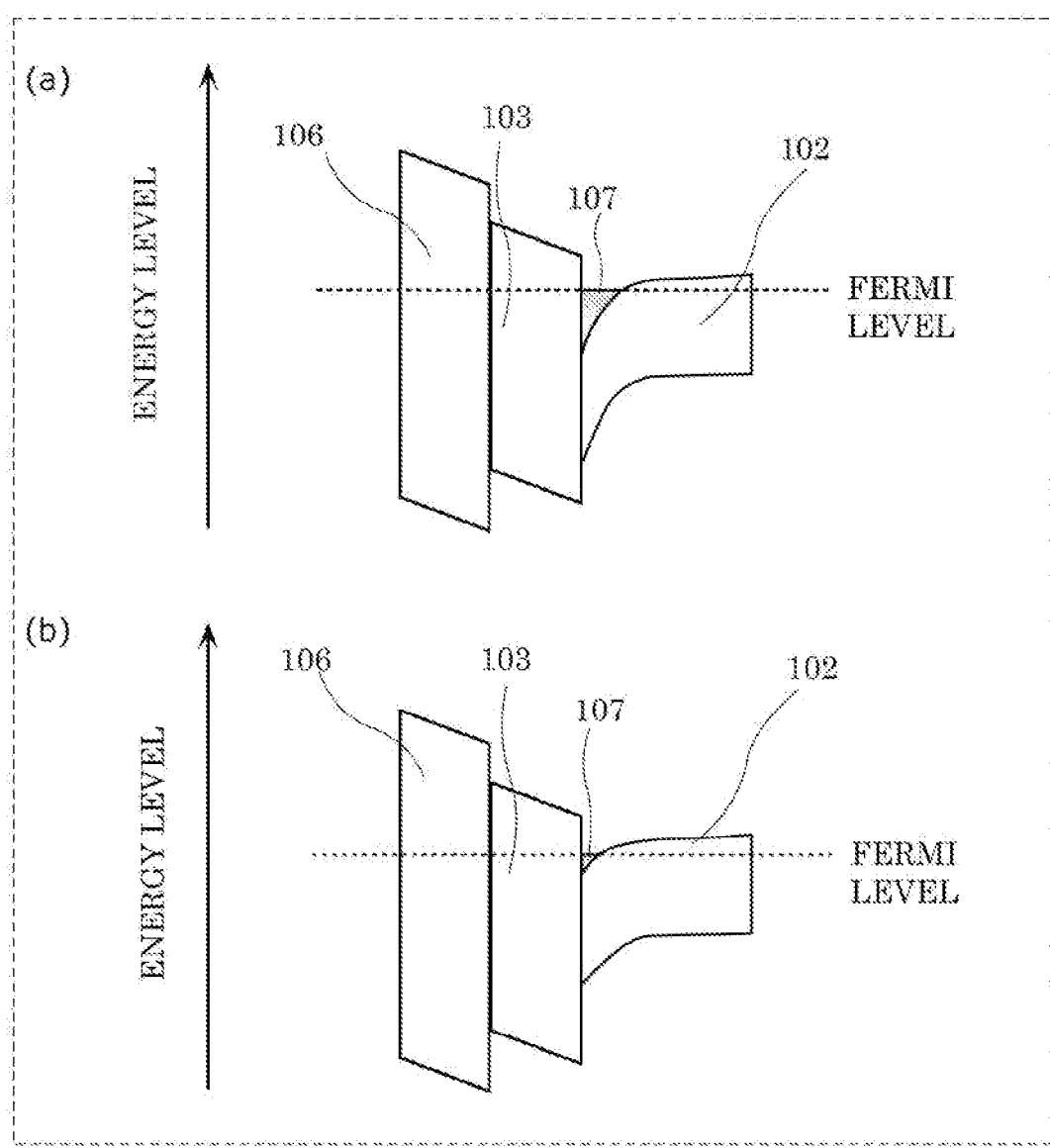
FIG. 18 is a diagram illustrating a situation in which a two-dimensional electron gas layer is generated when a potential is supplied to a first conduction control layer in the resistive element according to Embodiment 4.

FIG. 18 is a diagram illustrating a situation in which two-dimensional electron gas layer 107 is generated when a potential is supplied to first conduction control layer 127 in resistive element 100m according to Embodiment 4. More specifically, (a) in FIG. 18 is a diagram illustrating a case where a positive potential is supplied to first conduction control layer 127, and (b) in FIG. 18 is a diagram illustrating a case where a negative potential is supplied to first conduction control layer 127. For example, when a positive potential is supplied to first conduction control layer 127 a conduction band at an interface between first nitride semiconductor layer 102 and second nitride semiconductor layer 103 falls below a Fermi level, as illustrated in (a) in FIG. 18, and this generates a larger number of carriers in two-dimensional electron gas layer 107. In contrast, when a negative potential is supplied to first conduction control layer 127, a band of each of the components rises (i.e., the band shifts so that the energy level of each component gets higher) and a conduction band becomes higher than the Fermi level (the high energy side), as illustrated in (b) in FIG. 18, and this decreases the number of carriers in two-dimensional electron gas layer 107. By thus changing the potential to be supplied to first conduction control layer 127, the resistance value of two-dimensional electron gas layer 107 indicates any value.

Namely, it is possible to provide resistive element 100m having a desired resistance value. In addition, it can be also said that resistive element 100m according to this embodiment is a variable resistive element.

A voltage is supplied to first conduction control layer 127 from a source outside of resistive element portion 1000. For example, first conduction control layer 127 may be supplied with a fixed potential or a control potential from a source outside of resistive element portion 1000. The potential supplied to first conduction control layer 127 may be a ground potential. Moreover, a voltage is supplied neither from first electrode 113 nor from second electrode 114.

Note that first conduction control layer 127 according to this embodiment is not the gate electrode of a field effect transistor. As described above, first conduction control layer 127 supplies an electric field to two-dimensional electron gas layer 107 to control the resistance value of an electric resistance element, but does not block conduction between first electrode 113 and second electrode 114. Resistive element 100m is therefore not a normally-off field effect transistor.

Moreover, since first conduction control layer 127 is disposed above first insulating layer 106 and is isolated from second nitride semiconductor layer 103, resistive element 100m is not a junction field effect transistor. Accordingly, a potential to be supplied to first conduction control layer 127 for controlling the resistance value of resistive element 100m needs to be very low and resistive element 100m is thus a variable resistive element readily utilized for a control circuit.

Note that the longer the length of first conduction control layer 127 in the direction in which first electrode 113 and second electrode 114 are aligned is, the larger an area that first conduction control layer 127 covers two-dimensional electron gas layer 107 gets. Therefore, the longer the length of first conduction control layer 127 is, the more allowed it is to readily supply an electric field to two-dimensional electron gas layer 107. It is thus possible to more easily control the resistance value of two-dimensional electron gas layer 107.

Note that the resistance-value stabilization structure described in Embodiment 1 or any one of the variations thereof may be used for the resistance-value stabilization structure according to this embodiment. In this embodiment, with a potential supplied to first conduction control layer 127, the resistance value of two-dimensional electron gas layer 107 is set to a desired value, and what is more, the resistance-value stabilization structure is used to stabilize the resistance value that has been set to the desired value.

Variation 1 of Embodiment 4

Although Embodiment 4 has illustrated an example of the resistive element that includes a single conduction control layer, a resistive element according to the present disclosure is not limited to this example. This variation is different from Embodiment 4 in that a resistive element includes a plurality of conduction control layers. Note that in this variation, detailed description of structural elements commonly shared with Embodiment 4 will be omitted.

Figure 19:
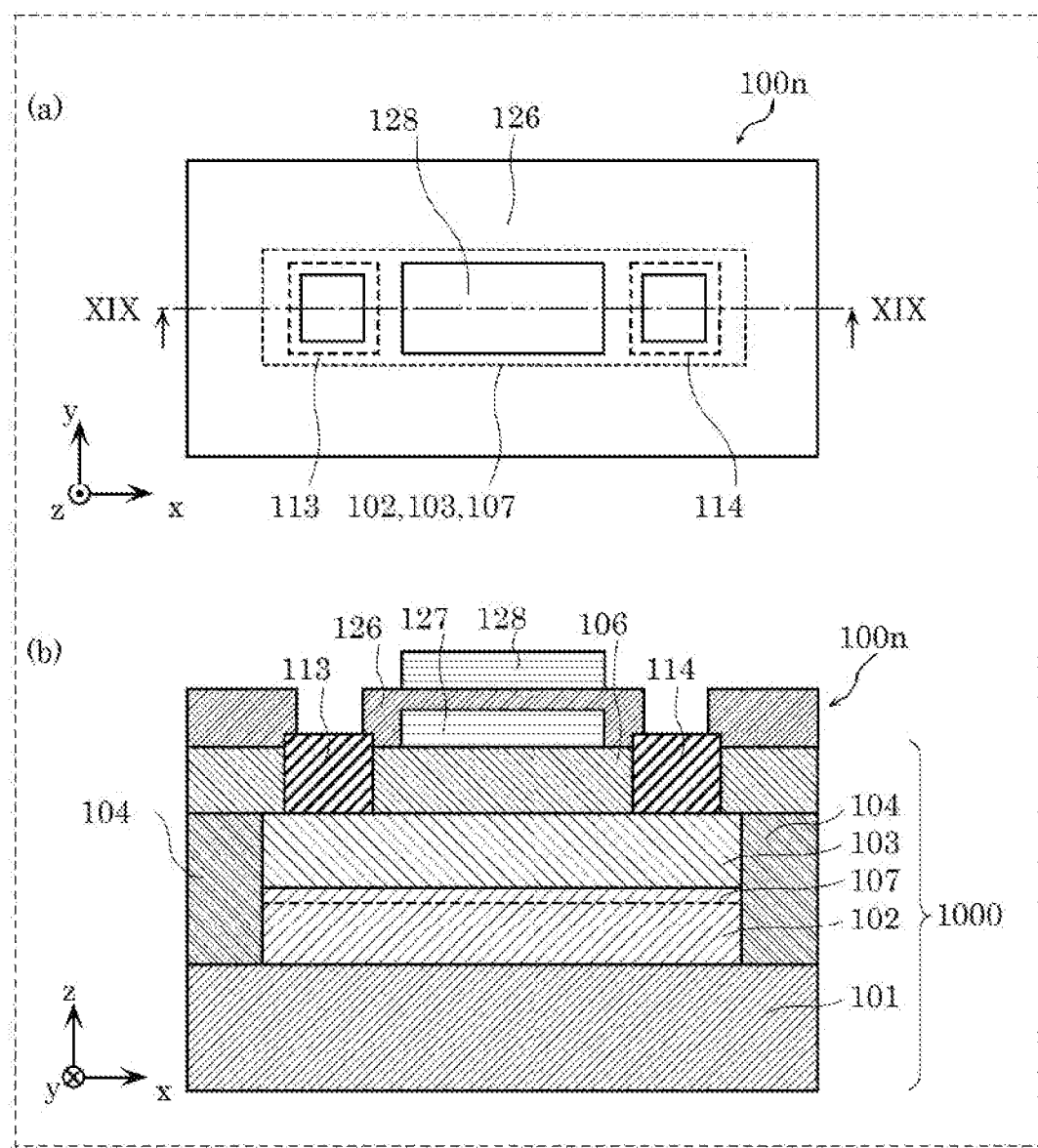
FIG. 19 illustrates a plan view and a cross-sectional view of a resistive element according to Variation 1 of Embodiment 4.

FIG. 19 illustrates a plan view and a cross-sectional view of resistive element 100n according to Variation 1 of Embodiment 4. More specifically, (a) in FIG. 19 is the plan view of resistive element 100n, and (b) in FIG. 19 is the cross-sectional view illustrating a cross section of resistive element 100n taken along the line XIX-XIX in (a) in FIG. 19.

Resistive element 100n includes the structural elements included in resistive element 100m according to Embodiment 4, second insulating layer 126, and second conduction control layer 128.

Second insulating layer 126 is disposed above first insulating layer 106 and first conduction control layer 127. As illustrated in FIG. 19, second insulating layer 126 is disposed to cover first conduction control layer 127. Second insulating layer 126 is disposed to surround first electrode 113 and second electrode 114 in plan view. As illustrated in (b) in FIG. 19, second insulating layer 126 is provided neither above first electrode 113 nor above second electrode 114 and opening portions are provided. For this reason, the top surfaces of first electrode 113 and second electrode 114 are exposed.

Second insulating layer 126 is made of SiN. Second insulating layer 126 may be made of, for example, $SiO_2$, SiON, or AlN. Second insulating layer 126 and first insulating layer 106 may, but not limited to, have the same materials and the same compositions.

Second conduction control layer 128 is disposed on an insulating layer (second insulating layer 126) between first electrode 113 and second electrode 114 in the plan view. A length of second conduction control layer 128 in a direction in which first electrode 113 and second electrode 114 are aligned (a length in the x-axis direction in FIG. 19) in the plan view is at least half the space between first electrode 113 and second electrode 114. In the plan view, first conduction control layer 127 and second conduction control layer 128 may be disposed to overlap each other.

Second conduction control layer 128 supplies an electric field to two-dimensional electron gas layer 107 to control the resistance value of an electric resistance element, in accordance with a voltage supplied from a source outside of resistive element portion 1000.

With changes in the potentials to be supplied to first conduction control layer 127 and second conduction control layer 128, the resistance value of two-dimensional electron gas layer 107 indicates any value, as described in Embodiment 4.

Namely, it is possible to provide resistive element 100n having a desired resistance value. It can be also said that resistive element 100n according to this embodiment is a variable resistive element.

Note that the potential supplied to second conduction control layer 128 may be substantially same as or different from the potential of first conduction control layer 127.

The following describes an example in which resistive element 100n and field effect transistor 200n according to this variation are provided on the same substrate (substrate 101 in this variation).

Figure 20:
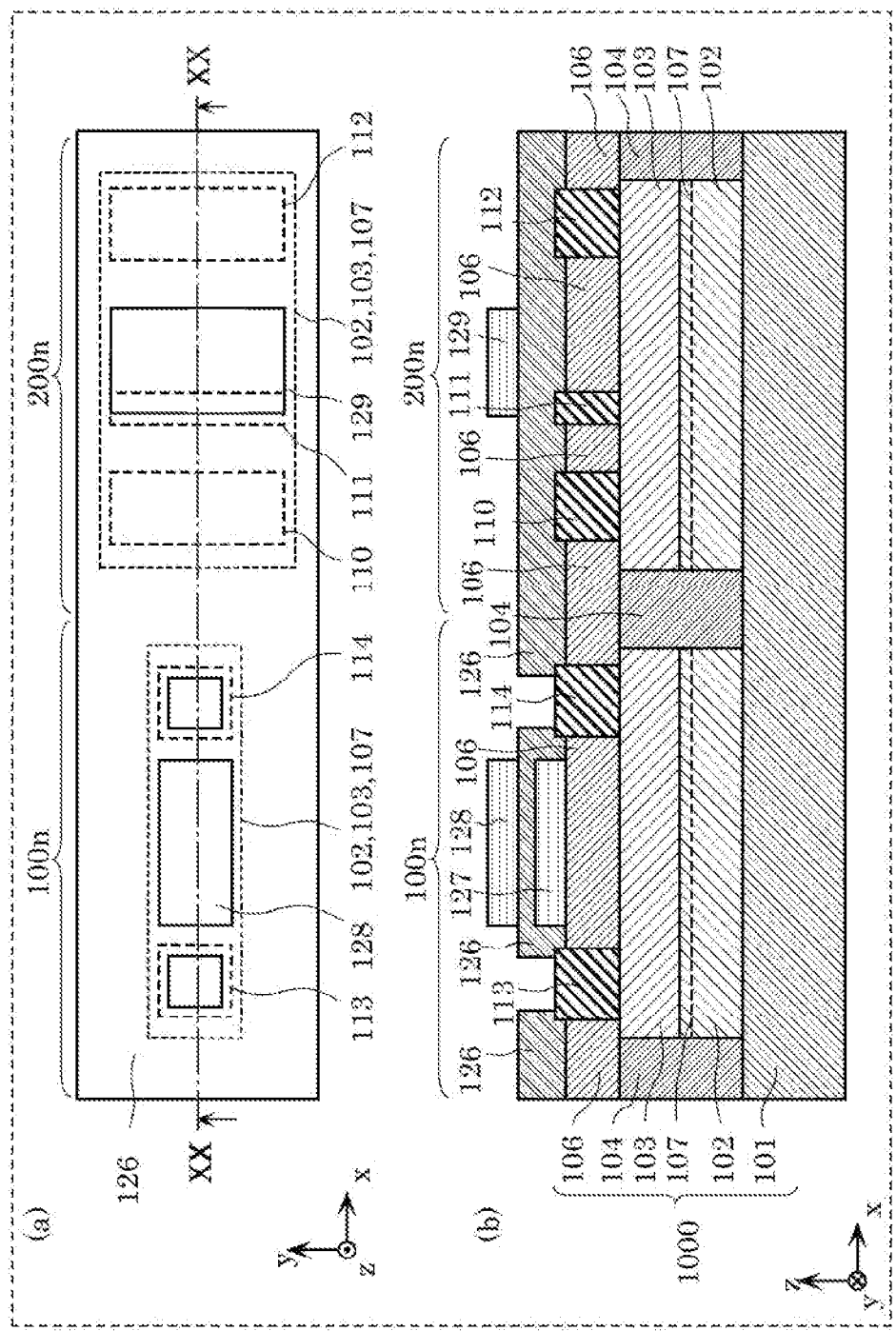
FIG. 20 illustrates a plan view and a cross-sectional view of the resistive element and a field effect transistor according to Variation 1 of Embodiment 4.

FIG. 20 illustrates a plan view and a cross-sectional view of resistive element 100n and field effect transistor 200n according to Variation 1 of Embodiment 4. More specifically, (a) in FIG. 20 is the plan view illustrating resistive element 100n and field effect transistor 200n, and (b) in FIG. 20 is the cross-sectional view illustrating a cross section of resistive element 100n and a cross section of field effect transistor 200n which are taken along the line XX-XX in (a) in FIG. 20.

Field effect transistor 200n according to this variation is disposed above substrate 101 included in resistive element 100n. In other words, resistive element 100n and field effect transistor 200n are each a one-chip semiconductor that is provided on the same substrate.

Field effect transistor 200n includes substrate 101, first nitride semiconductor layer 102, second nitride semiconductor layer 103, two-dimensional electron gas layer 107, source electrode 110, gate electrode 111, drain electrode 112, first insulating layer 106, second insulating layer 126, isolation layer 104, and field plate electrode 129.

Note that detailed description of the structural elements included in field effect transistor 200 described in Variation 1 of Embodiment 1 will be omitted.

In this variation, resistive element 100n and field effect transistor 200n are electrically isolated from each other by isolation layer 104.

Field plate electrode 129 alleviates electric field concentration to increase the withstand voltage of field effect transistor 200n.

For example, structural elements that are commonly provided for resistive element 100n and field effect transistor 200n and are assigned with like reference signs may be formed at the same time, as illustrated in FIG. 20.

First electrode 113 and second electrode 114 in resistive element 100n and source electrode 110 and drain electrode 112 in field effect transistor 200n may have the same layered structures or may be formed at the same time in the same process.

First conduction control layer 127 in resistive element 100n and gate electrode 111 in field effect transistor 200n may have the same layered structures or may be formed at the same time in the same process.

Second conduction control layer 128 in resistive element 100n and field plate electrode 129 in field effect transistor 200n may have the same layered structures or may be formed at the same time in the same process.

Thus, it is possible to provide, on the same substrate, resistive element 100n and field effect transistor 200n according to this variation. Moreover, since each of the common structural elements included in resistive element 100n and field effect transistor 200n may be formed at the same time in the same process, it is possible to easily manufacture resistive element 100n and field effect transistor 200n.

Embodiment 5

The following describes a power amplifier circuit for which the resistive element according to Embodiment 4 or Variation 1 thereof is used. It should be noted that in this embodiment, detailed description of structural elements commonly shared with Embodiment 4 and Variation 1 thereof will be omitted.

Figure 21A:
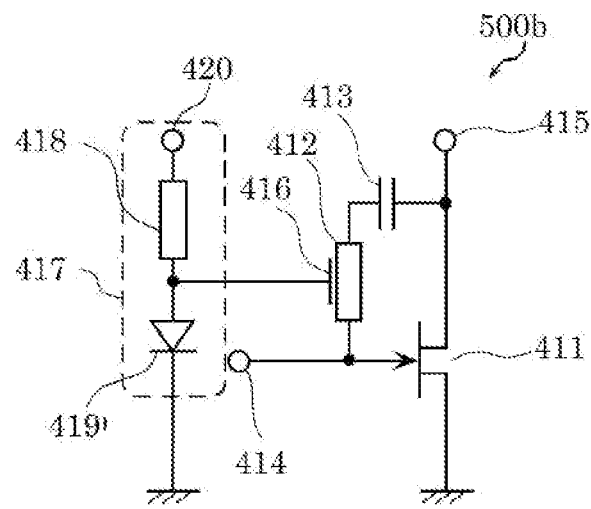
FIG. 21A is a circuit diagram illustrating a power amplifier circuit according to Embodiment 5.
Figure 21B:
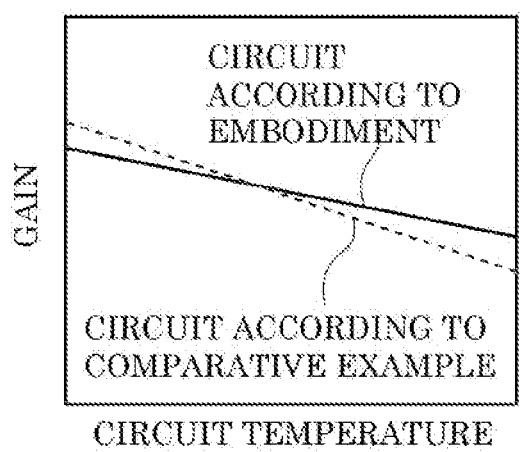
FIG. 21B is a diagram illustrating temperature dependence of a gain of a field effect transistor included in the power amplifier circuit according to Embodiment 5.

FIG. 21A is a circuit diagram illustrating power amplifier circuit 500b according to Embodiment 5. FIG. 21B is a diagram illustrating temperature dependence of a gain of power amplifier circuit 500b according to Embodiment 5. Note that a temperature indicated in FIG. 21B is a temperature of power amplifier circuit 500b.

Power amplifier circuit 500b includes resistive element 100m described in Embodiment 4, and field effect transistor 411 that is disposed above substrate 101 included in resistive element 100m, and capacitor 413.

Field effect transistor 411 includes a source electrode, a drain electrode, and a gate electrode. One of first electrode 113 and second electrode 114 included in resistive element 100m is electrically connected to the gate electrode whereas the other of first electrode 113 and second electrode 114 is electrically connected to the drain electrode via capacitor 413.

Power amplifier circuit 500b may include gate terminal 414 and drain terminal 415 connected to the gate electrode and the drain electrode of field effect transistor 411, respectively, voltage generator circuit 417, and resistance 412. In this embodiment, resistive element 100m is resistance 412 illustrated in FIG. 21A. First conduction control layer 127 included in resistive element 100m is conduction control layer 416.

Conduction control layer 416 is connected to voltage generator circuit 417. Voltage generator circuit 417 has a negative temperature coefficient.

Voltage generator circuit 417, as one example, includes resistance 418 and diode 419. One of terminals of resistance 418 is connected to positive bias application terminal 420 and the other of the terminals is connected to conduction control layer 416. Diode 419 has an anode connected to conduction control layer 416 and a cathode that is grounded.

In this embodiment, a negative feedback circuit including resistance 412 and capacitor 413 is connected to gate terminal 414 and drain terminal 415 of field effect transistor 411 for signal amplifier.

In a circuit according to a comparative example, which has resistance having a lower temperature coefficient than resistance 412, a gain fall at high temperature is large, as illustrated in FIG. 21B. However, in power amplifier circuit 500b, the resistance value of two-dimensional electron gas layer 107 included in resistive element 100m increases at high temperature and an amount of feedback in the negative feedback circuit decreases. Therefore, a gain fall at high temperature is moderated, as is the case of power amplifier circuit 500 according to Embodiment 2.

Furthermore, in this embodiment, since voltage generator circuit 417 has a negative temperature coefficient, a voltage to be applied to conduction control layer 416 decreases at high temperature. As a result, the resistance value of two-dimensional electron gas layer 107 increases, an amount of feedback in the negative feedback circuit decreases, and a gain fall at high temperature is moderated. Accordingly, by using, for resistance 412 in the negative feedback circuit, resistive element 100m which includes two-dimensional electron gas layer 107 having a high temperature coefficient, and also by changing, by voltage generator circuit 417, an electric field to be supplied to two-dimensional electron gas layer 107, it is possible to suppress a gain fall at high temperature.

Embodiment 6

The following describes a power amplifier circuit for which the resistive element according to Embodiment 4 or Variation 1 thereof is used. In Embodiment 5, the resistive element is included in the negative feedback circuit, but a resistive element according to the present disclosure is not limited to such a resistive element. In Embodiment 6, a resistive element is included in a bias circuit that supplies a gate voltage to a field effect transistor to set a drain current of the field effect transistor. It should be noted that in this embodiment, detailed description of structural elements commonly shared with Embodiment 4 and the variation thereof will be omitted.

Figure 22A:
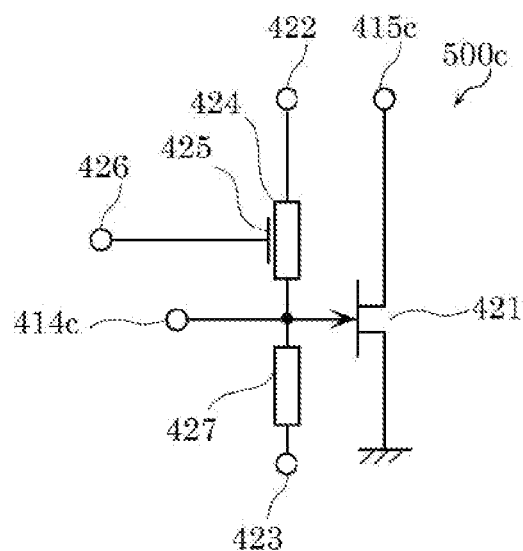
FIG. 22A is a circuit diagram illustrating a power amplifier circuit according to Embodiment 6.
Figure 22B:
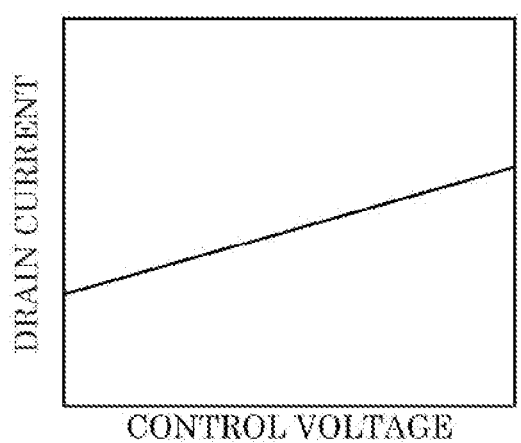
FIG. 22B is a diagram illustrating a relation between a control voltage and a drain current of a field effect transistor included in the power amplifier circuit according to Embodiment 6.

FIG. 22A is a circuit diagram illustrating power amplifier circuit 500c according to Embodiment 6. FIG. 22B is a diagram illustrating a relation between a control voltage and a drain current of field effect transistor 421 included in power amplifier circuit 500c according to Embodiment 6.

Power amplifier circuit 500c includes field effect transistor 421 and a bias circuit. Power amplifier circuit 500c may include first gate bias terminal 422, second gate bias terminal 423, first resistance 424, second resistance 427, conduction control layer 425, control terminal 426, and gate terminal 414c and drain terminal 415c connected to the gate electrode and the drain electrode of field effect transistor 421, respectively.

The bias circuit includes resistive element 100m described in Embodiment 4. The bias circuit supplies a gate voltage to field effect transistor 421 to set a drain current of field effect transistor 421.

Resistive element 100m is at least one of first resistance 424 or second resistance 427. In this embodiment, first resistance 424 is resistive element 100m. First conduction control layer 127 included in resistive element 100m is conduction control layer 425. Conduction control layer 425 is connected to control terminal 426.

Field effect transistor 421 is disposed above substrate 101 included in resistive element 100m and includes a source electrode, a drain electrode, and a gate electrode.

A voltage higher than that of second gate bias terminal 423 may be applied to first gate bias terminal 422 and one of first gate bias terminal 422 and second gate bias terminal 423 may be grounded.

In this embodiment, with an additional change in a voltage (control voltage) to be applied to control terminal 426, the resistance value of first resistance 424 changes, the gate voltage of field effect transistor 421 changes, and the drain current of field effect transistor 421 changes, as illustrated in FIG. 22B. In other words, by controlling the voltage to be applied to control terminal 426, it is possible to control the drain current of field effect transistor 421.

The following describes a case where the following conditions are defined. Specifically, field effect transistor 421 is a normally-on field effect transistor and a negative potential is supplied to second gate bias terminal 423. In this case, with a positive potential supplied to control terminal 426, it is possible to control a drain current value of field effect transistor 421.

Note that second resistance 427 may be resistive element 100m. In such a case, the polarity of the drain current of field effect transistor 421 is changed to the opposite in response to a voltage applied to control terminal 426.

Embodiment 7

The following describes a power amplifier circuit for which the resistive element according to Embodiment 4 or Variation 1 thereof is used. In Embodiment 6, a conduction control layer included in the resistive element is connected to the control terminal, but a conduction control layer included in a resistive element according to the present disclosure is not limited to such a conduction control layer. In Embodiment 7, a conduction control layer included in a resistive element is connected to a voltage generator circuit having a positive temperature coefficient. It should be noted that in this embodiment, detailed description of structural elements commonly shared with Embodiment 4 and Variation 1 thereof will be omitted.

Figure 23A:
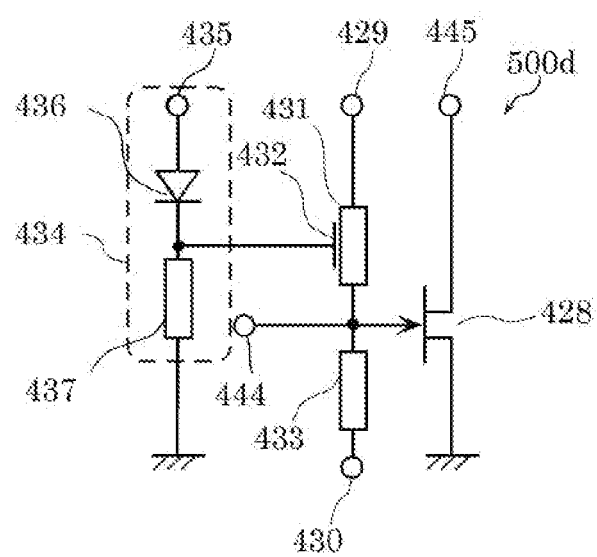
FIG. 23A is a circuit diagram illustrating a power amplifier circuit according to Embodiment 7.
Figure 23B:
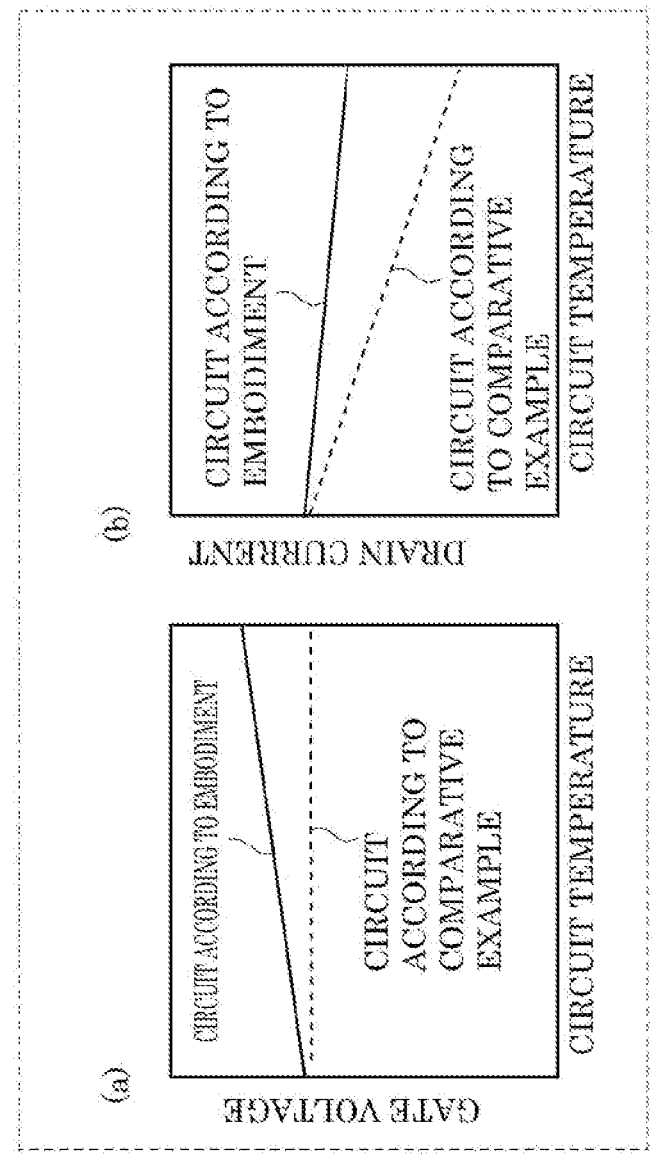
FIG. 23B is a diagram illustrating temperature dependences of a gate voltage and a drain current of a field effect transistor according to Embodiment 7.

FIG. 23A is a circuit diagram illustrating power amplifier circuit 500d according to Embodiment 7. FIG. 23B is a diagram illustrating temperature dependences of a gate voltage and a drain current of field effect transistor 428 according to Embodiment 7. Note that a temperature indicated in FIG. 23B is a temperature of power amplifier circuit 500d.

More specifically, (a) in FIG. 23B illustrates temperature dependence of the gate voltage of field effect transistor 428 and (b) in FIG. 23B illustrates temperature dependence of the drain current of field effect transistor 428.

Power amplifier circuit 500d includes field effect transistor 428 and a bias circuit. Power amplifier circuit 500d may include first gate bias terminal 429, second gate bias terminal 430, first resistance 431, second resistance 433, conduction control layer 432, voltage generator circuit 434, and gate terminal 444 and drain terminal 445 connected to the gate electrode and the drain electrode of field effect transistor 428, respectively.

The bias circuit includes resistive element 100m described in Embodiment 4. The bias circuit supplies a gate voltage to field effect transistor 428 to set a drain current of field effect transistor 428.

Resistive element 100m is at least one of first resistance 431 or second resistance 433. In this embodiment, first resistance 431 is resistive element 100m. First conduction control layer 127 included in resistive element 100m is conduction control layer 432. Conduction control layer 432 is connected to voltage generator circuit 434.

Voltage generator circuit 434 has a positive temperature coefficient. Voltage generator circuit 434, as one example, includes diode 436 and resistance 437. Diode 436 has an anode connected to positive bias application terminal 435 and a cathode connected to conduction control layer 432. One of terminals of resistance 437 is connected to conduction control layer 432 and the other of the terminals is grounded.

A voltage higher than that of second gate bias terminal 430 may be applied to first gate bias terminal 429 and one of first gate bias terminal 429 and second gate bias terminal 430 may be grounded.

Field effect transistor 428 is disposed above substrate 101 included in resistive element 100m. Field effect transistor 428 includes a source electrode, a drain electrode, and a gate electrode.

As described in the description of power amplifier circuit 500a according to Embodiment 3, it is possible to easily control the drain current of field effect transistor 428 by controlling the temperature coefficients of first resistance 431 and second resistance 433.

Furthermore, in this embodiment, since voltage generator circuit 434 has a positive temperature coefficient, a voltage applied to conduction control layer 432 rises. As a result, the resistance of first resistance 431 decreases, and this increases the gate voltage of field effect transistor 428, as illustrated in FIG. 23B. A circuit according to a comparative example, which has a fixed gate voltage, will be described. In the case of using the circuit according to the comparative example, a current decreases greatly at high temperature, as illustrated in FIG. 23B. In contrast, field effect transistor 428 according to this embodiment is capable of suppressing such a current decrease at high temperature.

Note that second resistance 433 may be resistive element 100m. In such a case, when conduction control layer 432 is connected to a voltage generator circuit having a negative temperature coefficient, the same advantageous effects are produced as those attained in the case where first resistance 431 is resistive element 100m.

OTHER EMBODIMENTS

Although the resistive element and others according to the present disclosure have been described above based on each of the embodiments and the variations thereof, the present disclosure is not limited to these embodiments and variations. The scope of the present disclosure encompasses embodiments obtained by making various modifications that persons skilled in the art could conceive to the embodiments as well as other embodiments obtained by combining part of structural elements described in the embodiments and the variations thereof, without deviating from the spirit of the present disclosure.

Specifically, the resistance-value stabilization structure described in Variation 1 of Embodiment 1 may be combined with the resistance-value stabilization structure described in Variation 2 or 3 of Embodiment 1. In this case, since a surface level is canceled due to Si dangling-bonds and trapped electrons are also canceled, the resistance value of the two-dimensional electron gas layer is much less apt to change. It is therefore possible to provide a resistive element which exhibits a resistance value that is more stable with less fluctuation.

As another concrete example, the resistance-value stabilization structure described in Variation 1 of Embodiment 1 may be combined with the resistance-value stabilization structure described in Variation 4 or 5 of Embodiment 1. In this case, since a surface level is canceled due to Si dangling-bonds and trapped electrons are extracted, the resistance value of the two-dimensional electron gas layer is much less apt to change. It is therefore possible to provide a resistive element which exhibits a resistance value that is more stable with less fluctuation.

Although Embodiment 2 or 3 has illustrated an example of a power amplifier circuit that includes resistive element 100 according to Embodiment 1, a power amplifier circuit according to the present disclosure is not limited to this example. For example, the power amplifier circuit according to Embodiment 2 or 3 may include the resistive element according to any one of the variations of Embodiment 1.

Although Embodiment 5, 6, or 7 has illustrated an example of a power amplifier circuit that includes resistive element 100$m$ according to Embodiment 4, a power amplifier according to the present disclosure is not limited to this example. For example, the power amplifier circuit according to Embodiment 5, 6, or 7 may include resistive element 100$n$ according to Variation 1 of Embodiment 4.

In the circuit diagram in FIG. 15A, FIG. 16A. FIG. 21A, FIG. 22A, or FIG. 23A, a field effect transistor is denoted by a sign indicating an n-channel junction field effect transistor, but a field effect transistor according to the present disclosure is not limited to this. For example, the field effect transistor in each of these circuit diagrams (i.e., the field effect transistor described in Embodiment 2, 3, 5, 6, or 7) may be a p-channel junction field effect transistor or an n-channel metal oxide semiconductor (MOS) field effect transistor or a p-channel MOS field effect transistor. It should be noted that in such a MOS field effect transistor, the material of a gate electrode may be metal or a semiconductor.

Various modifications, replacements, additions, and omissions may be made to the aforementioned embodiments within the scope of claims or equivalence thereof.

INDUSTRIAL APPLICABILITY

The present disclosure can provide a resistive element which exhibits a resistance value that is stable with less fluctuation, and thus stabilize circuit characteristics. With a configuration that provides a conduction control layer, it is also possible to achieve a variable resistive element that is stable with an arbitrary potential supplied thereto and to create a compensation circuit.

The invention claimed is:

1. A resistive element, comprising:
a substrate;
a first nitride semiconductor layer above the substrate;
a second nitride semiconductor layer above the first nitride semiconductor layer, the second nitride semiconductor layer having a band gap larger than a band gap of the first nitride semiconductor layer;
a two-dimensional electron gas layer on a first nitride semiconductor layer side at an interface between the first nitride semiconductor layer and the second nitride semiconductor layer;
a first electrode disposed above the first nitride semiconductor layer and ohmically connected to the two-dimensional electron gas layer;
a second electrode disposed above the first nitride semiconductor layer and apart from the first electrode in plan view, and ohmically connected to the two-dimensional electron gas layer; and
an insulating layer between the first electrode and the second electrode in the plan view, the insulating layer being in contact with a top surface of the second nitride semiconductor layer, wherein
the two-dimensional electron gas layer between the first electrode and the second electrode in the plan view functions as an electric resistance element,
a conductive layer is not provided above the insulating layer between the first electrode and the second electrode in the plan view,
the resistive element has a resistance-value stabilization structure that functions to keep a resistance value of the electric resistance element constant,
in the resistance-value stabilization structure, the insulating layer is made of silicon nitride (SiN), and
a composition ratio of Si/N of the insulating layer at an interface between the insulating layer and the second nitride semiconductor layer is at least 1.1 and at most 2.3.

2. A resistive element, comprising:
a substrate;
a first nitride semiconductor layer above the substrate;
a second nitride semiconductor layer above the first nitride semiconductor layer, the second nitride semiconductor layer having a band gap larger than a band gap of the first nitride semiconductor layer;
a two-dimensional electron gas layer on a first nitride semiconductor layer side at an interface between the first nitride semiconductor layer and the second nitride semiconductor layer;
a first electrode disposed above the first nitride semiconductor layer and ohmically connected to the two-dimensional electron gas layer;
a second electrode disposed above the first nitride semiconductor layer and apart from the first electrode in plan view, and ohmically connected to the two-dimensional electron gas layer; and
an insulating layer between the first electrode and the second electrode in the plan view, the insulating layer being in contact with a top surface of the second nitride semiconductor layer, wherein
the two-dimensional electron gas layer between the first electrode and the second electrode in the plan view functions as an electric resistance element, a conductive layer is not provided above the insulating layer between the first electrode and the second electrode in the plan view, the resistive element has a resistance-value stabilization structure that functions to keep a resistance value of the electric resistance element constant, the resistance-value stabilization structure includes a first hole injection electrode that:
   is disposed in contact with a top surface of the second nitride semiconductor layer on a first electrode side between the first electrode and the second electrode,
   is electrically connected to the first electrode, and
   injects a hole in the second nitride semiconductor layer when a potential of the first electrode is higher than a potential of the second electrode, and the resistance-value stabilization structure further includes a second hole injection electrode that:
   is disposed in contact with the top surface of the second nitride semiconductor layer on a second electrode side between the first electrode and the second electrode,
   is electrically connected to the second electrode, and
   injects a hole in the second nitride semiconductor layer when the potential of the second electrode is higher than the potential of the first electrode.

3. A power amplifier circuit, comprising:
a resistive element;
a field effect transistor; and
a capacitor, wherein
the resistive element includes:
   a substrate;
   a first nitride semiconductor layer above the substrate;
   a second nitride semiconductor layer above the first nitride semiconductor layer, the second nitride semiconductor layer having a band gap larger than a band gap of the first nitride semiconductor layer;
   a two-dimensional electron gas layer on a first nitride semiconductor layer side at an interface between the first nitride semiconductor layer and the second nitride semiconductor layer;
   a first electrode disposed above the first nitride semiconductor layer and ohmically connected to the two-dimensional electron gas layer;
   a second electrode disposed above the first nitride semiconductor layer and apart from the first electrode in plan view, and ohmically connected to the two-dimensional electron gas layer; and
   an insulating layer between the first electrode and the second electrode in the plan view, the insulating layer being in contact with a top surface of the second nitride semiconductor layer,
the two-dimensional electron gas layer between the first electrode and the second electrode in the plan view functions as an electric resistance element,
a conductive layer is not provided above the insulating layer between the first electrode and the second electrode in the plan view,
the resistive element has a resistance-value stabilization structure that functions to keep a resistance value of the electric resistance element constant,
the field effect transistor includes a source electrode, a drain electrode, and a gate electrode, and is provided above the substrate, and is provided above the substrate,
one of the first electrode and the second electrode is electrically connected to the gate electrode, and
the other of the first electrode and the second electrode is electrically connected to the drain electrode via the capacitor.

4. A power amplifier circuit, comprising:
a field effect transistor; and
a bias circuit that supplies a gate voltage to the field effect transistor to set a drain current of the field effect transistor, wherein
the bias circuit includes a resistive element,
the resistive element includes:
   a substrate;
   a first nitride semiconductor layer above the substrate;
   a second nitride semiconductor layer above the first nitride semiconductor layer, the second nitride semiconductor layer having a band gap larger than a band gap of the first nitride semiconductor layer;
   a two-dimensional electron gas layer on a first nitride semiconductor layer side at an interface between the first nitride semiconductor layer and the second nitride semiconductor layer;
   a first electrode disposed above the first nitride semiconductor layer and ohmically connected to the two-dimensional electron gas layer;
   a second electrode disposed above the first nitride semiconductor layer and apart from the first electrode in plan view, and ohmically connected to the two-dimensional electron gas layer; and
   an insulating layer between the first electrode and the second electrode in the plan view, the insulating layer being in contact with a top surface of the second nitride semiconductor layer,
the two-dimensional electron gas layer between the first electrode and the second electrode in the plan view functions as an electric resistance element,
a conductive layer is not provided above the insulating layer between the first electrode and the second electrode in the plan view,
the resistive element has a resistance-value stabilization structure that functions to keep a resistance value of the electric resistance element constant, and
the field effect transistor is provided above the substrate.

5. A resistive element, comprising:
a resistive element portion; and
a conduction control layer, wherein
the resistive element portion includes:
   a substrate;
   a first nitride semiconductor layer above the substrate;
   a second nitride semiconductor layer above the first nitride semiconductor layer, the second nitride semiconductor layer having a band gap larger than a band gap of the first nitride semiconductor layer;
   a two-dimensional electron gas layer on a first nitride semiconductor layer side at an interface between the first nitride semiconductor layer and the second nitride semiconductor layer;
   a first electrode disposed above the first nitride semiconductor layer and ohmically connected to the two-dimensional electron gas layer;
   a second electrode disposed above the first nitride semiconductor layer and apart from the first electrode in plan view, and ohmically connected to the two-dimensional electron gas layer; and
   an insulating layer between the first electrode and the second electrode in the plan view, the insulating layer being in contact with a top surface of the second nitride semiconductor layer, wherein the two-dimensional electron gas layer between the first electrode and the second electrode in the plan view functions as an electric resistance element, the conduction control layer:
- is disposed above the insulating layer between the first electrode and the second electrode in the plan view,
- has a length, in a direction in which the first electrode and the second electrode are aligned in the plan view, which is at least half a space between the first electrode and the second electrode, and
- supplies an electric field to the two-dimensional electron gas layer to control a resistance value of the electric resistance element, in accordance with a voltage supplied from a source outside of the resistive element portion, and the resistive element has a resistance-value stabilization structure that functions to keep a resistance value of the electric resistance element constant.

6. The resistive element according to claim 5, wherein
in the resistance-value stabilization structure, the insulating layer is made of silicon nitride (SiN), and
a composition ratio of Si/N of the insulating layer at an interface between the insulating layer and the second nitride semiconductor layer is at least 1.1 and at most 2.3.

7. The resistive element according to claim 5, wherein the resistance-value stabilization structure includes a stress buffer layer above the insulating layer.

8. The resistive element according to claim 5, wherein
the resistance-value stabilization structure includes an isolation layer that is disposed to surround the first nitride semiconductor layer in the plan view and that includes an inactive ion, and
a distance between a top surface of the isolation layer and a top surface of the substrate is less than a distance between a bottom surface of the two-dimensional electron gas layer and the top surface of the substrate.

9. The resistive element according to claim 5, wherein the resistance-value stabilization structure includes a high resistance layer that is disposed between the substrate and the first nitride semiconductor layer and has electrical resistivity higher than electrical resistivity of the substrate.

10. The resistive element according to claim 5, wherein
the resistance-value stabilization structure includes a low temperature-characteristic resistive element portion that is disposed above the substrate and has a temperature coefficient lower than a temperature coefficient of the two-dimensional electrode gas layer,
the low temperature-characteristic resistive element portion includes a third electrode and a fourth electrode disposed apart from the third electrode in the plan view,
the first electrode is connected to the third electrode, and
the second electrode is connected to the fourth electrode.

11. The resistive element according to claim 5, wherein in the resistance-value stabilization structure, each of the first electrode and the second electrode has an embedded portion such that the electrode contacts the two-dimensional electron gas layer, the embedded portion extending from the top surface of the second nitride semiconductor layer and including a portion of the first nitride semiconductor layer.

12. The resistive element according to claim 5, wherein in the resistance-value stabilization structure, the insulating layer is disposed apart from the first electrode and the second electrode in the plan view.

13. A power amplifier circuit, comprising:
the resistive element according to claim 5;
a field effect transistor above the substrate; and
a capacitor, wherein
the field effect transistor includes a source electrode, a drain electrode, and a gate electrode,
one of the first electrode and the second electrode is electrically connected to the gate electrode, and
the other of the first electrode and the second electrode is electrically connected to the drain electrode via the capacitor.

14. A power amplifier circuit, comprising:
a field effect transistor above the substrate; and
a bias circuit that supplies a gate voltage to the field effect transistor to set a drain current of the field effect transistor, wherein
the bias circuit includes the resistive element according to claim 5.

15. The resistive element according to claim 5, wherein the resistance-value stabilization structure includes a first hole injection electrode that:
is disposed in contact with a top surface of the second nitride semiconductor layer on a first electrode side between the first electrode and the second electrode,
is electrically connected to the first electrode, and
injects a hole in the second nitride semiconductor layer when a potential of the first electrode is higher than a potential of the second electrode.

16. The resistive element according to claim 15, wherein the resistance-value stabilization structure includes a first electron extraction electrode that:
is disposed in contact with the top surface of the second nitride semiconductor layer on a first electrode side between the first electrode and the second electrode in the plan view,
is electrically connected to the first electrode, and
extracts an electron from the second nitride semiconductor layer when a potential of the first electrode is higher than a potential of the second electrode.

17. The resistive element according to claim 5, wherein the resistance-value stabilization structure further includes a second electron extraction electrode that:
is disposed in contact with the top surface of the second nitride semiconductor layer on a second electrode side between the first electrode and the second electrode in the plan view,
is electrically connected to the second electrode, and
extracts an electron from the second nitride semiconductor layer when the potential of the second electrode is higher than the potential of the first electrode.

18. The resistive element according to claim 17, wherein the resistance-value stabilization structure further includes a second hole injection electrode that:
is disposed in contact with the top surface of the second nitride semiconductor layer on a second electrode side between the first electrode and the second electrode,
is electrically connected to the second electrode, and
injects a hole in the second nitride semiconductor layer when the potential of the second electrode is higher than the potential of the first electrode.

\* \* \* \* \*